United States Patent
Hyun et al.

(10) Patent No.: US 7,230,857 B2
(45) Date of Patent: Jun. 12, 2007

(54) METHODS OF MODIFYING OPERATIONAL CHARACTERISTIC OF MEMORY DEVICES USING CONTROL BITS RECEIVED THROUGH DATA PINS AND RELATED DEVICES AND SYSTEMS

(75) Inventors: Dong-ho Hyun, Gyeonggi-do (KR); Seok-won Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 345 days.

(21) Appl. No.: 10/930,604

(22) Filed: Aug. 31, 2004

(65) Prior Publication Data

US 2005/0270854 A1 Dec. 8, 2005

(30) Foreign Application Priority Data

Jun. 3, 2004 (KR) .................. 10-2004-0040324

(51) Int. Cl.
*G11C 7/10* (2006.01)
(52) U.S. Cl. .................. 365/189.03; 365/189.05; 365/189.08; 365/191; 711/170
(58) Field of Classification Search ........... 365/189.03, 365/189.05, 189.08; 711/170
See application file for complete search history.

(56) References Cited

U.S. PATENT DOCUMENTS

| | | | | |
|---|---|---|---|---|
| 4,604,693 A * | 8/1986 | Chadima et al. | ............ | 340/825 |
| 5,179,694 A * | 1/1993 | Keida et al. | .................... | 714/1 |
| 5,491,655 A * | 2/1996 | Hirose et al. | ............... | 365/177 |
| 5,802,268 A * | 9/1998 | Fisher et al. | .................. | 714/25 |
| 5,826,068 A * | 10/1998 | Gates | .......................... | 713/600 |
| 5,881,295 A * | 3/1999 | Iwata | .......................... | 710/262 |
| 5,966,723 A * | 10/1999 | James et al. | ................ | 711/103 |
| 6,028,805 A * | 2/2000 | Higuchi | ...................... | 365/222 |
| 6,041,002 A * | 3/2000 | Maejima | ...................... | 365/201 |
| 6,141,700 A * | 10/2000 | Iwata | ............................. | 710/3 |
| 6,393,576 B1 * | 5/2002 | Gates et al. | ................ | 713/600 |
| 6,946,982 B1 * | 9/2005 | Mu et al. | ...................... | 341/50 |
| 2002/0049556 A1 | 4/2002 | Lee | | |

\* cited by examiner

*Primary Examiner*—Viet Q. Nguyen
(74) *Attorney, Agent, or Firm*—Myers Bigel Sibley & Sajovec

(57) ABSTRACT

An integrated circuit memory device may include a memory cell array, a plurality of data input/output pins, and a plurality of input/output circuits coupled to respective data input/output pins. The input/output circuits may be configured to accept respective data bits being written to the memory cell array from the respective data input/output pins during a write operation, and the input/output circuits may be configured to provide respective data bits being read from the memory cell array to the respective data input/output pins during a read operation. In addition, the input/output circuits may be configured to modify operational characteristics thereof responsive to respective control bits received through the respective data input/output pins during a mode set operation. Related methods and systems are also discussed.

73 Claims, 18 Drawing Sheets

FIG. 3C

| SYMBOL | DESCRIPTION |
|---|---|
| CLK | CLOCK : ALL ADDRESS AND CONTROL INPUT SIGNALS ARE SAMPLED ON THE EDGE OF CLK. INTERNAL CLOCK SIGNALS ARE DERIVED FROM CLK. |
| /CS | CHIP SELECT : /CS ENABLES (REGISERED LOW) AND DISABLES (REGISTERED HIGH) THE COMMAND DECODER. ALL COMMANDS ARE MASKED WHEN /CS IS REGISTERED HIGH. /CS IS CONSIDERED PART OF THE COMMAND CODE. |
| /RAS, /CAS, /WE | COMMAND INPUTS : /RAS, /CAS AND /WE (ALONG WITH /CS) DEFINE THE COMMAND BEING ENTERED. |
| A[11:1] | ADDRESS INPUTS : PROVIDES THE ROW ADDRESS FOR ACTIVE COMMANDS, THE COLUMN ADDRESS FOR READ/WRITE COMMANDS TO SELECT ONE LOCATION OUT OF THE MEMORY ARRAY IN THE RESPECTIVE BANK. THE ADDRESS INPUTS ALSO PROVIDE THE OP-CODE DURING A MODE REGISTER SET (MRS) COMMAND. |
| DQ[16:1] | DATA INPUT/OUTPUT : DATA BUS |
| VDD | POWER SUPPLY |
| VSS | GROUND |

METHODS OF MODIFYING OPERATIONAL CHARACTERISTIC OF MEMORY DEVICES USING CONTROL BITS RECEIVED THROUGH DATA PINS AND RELATED DEVICES AND SYSTEMS

RELATED APPLICATION

This application claims the benefit of priority from Korean Patent Application No. 2004-0040324, filed Jun. 3, 2004. The disclosure of the above referenced Korean Application is hereby incorporated herein in its entirety by reference.

FIELD OF THE INVENTION

The present invention relates to the field of integrated circuit devices and more particularly to integrated circuit memory devices, systems, and methods.

BACKGROUND

An integrated circuit memory device, such as a dynamic random access memory (DRAM) device 11, may include a plurality of data input/output pins 30-1 to 30-$n$ coupled to respective input/output buffers 32-1 to 32-$n$, as shown in FIG. 1. Moreover, each of the input/output buffers 32-1 to 32-$n$ may include a respective input circuit 10-1 to 10-$n$ and a respective output circuit 20-1 to 20-$n$. The input/output buffers can thus be used when writing data DQ-1 to DQ-n from the data pins 30-1 to 30-$n$ to memory cell array 40 during a write operation and when reading data DQ-1 to DQ-n from memory cell array 40 during a read operation.

The memory device 11 may also include a mode set decoder 36 that may generate a single mode set signal MSS used to set a characteristic of the output circuits 20-1 to 20-$n$. More particularly, command signals /CS, /RAS, /CAS, and /WE received by command decoder 35 may specify a read operation, a write operation, or a mode set operation. During read/write operations, signals ADDR received over an address bus at address buffer 37 may define memory cells of array 40 from/to which data is to be read/written. During mode set operations, signals ADDR received over the address bus at mode set decoder 36 may define mode set codes. In response to a mode set code received during a mode set operation, the same mode set signal MSS may be provided to all of the output circuits 20-1 to 20-$n$ so that all of the output circuits 20-1 to 20-$n$ are set to a same mode of operation. A single mode set signal MSS, however, may be unable to provide separate control of individual output circuits.

The integrated circuit memory device 12 of FIG. 2 may include input/output buffers 32-1 to 32-$n$ coupled between respective data input/output pins 30-1 to 30-$n$ and memory cell array 40, as discussed above with respect to FIG. 1. Moreover, each of the data input/output buffers 32-1 to 32-$n$ may include a respective input circuit 10-1 to 10-$n$ and a respective output circuit 20-1 to 20-$n$. In addition, the memory device 12 includes a command decoder 35, an address buffer 36, and mode set controller 38. The mode set controller 38 includes mode set decoders 38-1 to 38-$n$ corresponding to each of the input/output buffers 32-1 to 32-$n$ so that a separate mode set signal MSS1 to MSSn is generated for each respective input/output buffer 32-1 to 32-$n$. Accordingly, separate control of a same characteristic of the input/output buffers may be provided. The plurality of separate lines between the mode set controller 38 and each of the input/output buffers 32-1 to 32-$n$, however, may be undesirable.

Independent output driver calibration is also discussed for example in U.S. Patent Publication No. 2002/0049556, the disclosure of which is hereby incorporated herein in its entirety by reference. As discussed in U.S. Patent Publication No. 2002/0049556, characteristics of multiple drivers for output buffer circuits may be independently adjusted or calibrated without significantly increasing the associated necessary circuitry. A central control logic circuit initiates the calibration process of the drivers. A serial communication link is provided between the control logic and each of the output drivers. The serial link reduces the number of lines that are required to communicate between the central control logic and the multiple output drivers. The output drivers can be calibrated one at a time, and a handoff is made from one driver to the next to start the calibration of the subsequent driver.

SUMMARY

According to embodiments of the present invention, an integrated circuit memory device may include a memory cell array, a plurality of data input/output pins, and a plurality of input/output circuits coupled to respective data input/output pins. The input/output circuits may be configured to accept respective data bits being written to the memory cell array from the respective data input/output pins during a write operation. The input/output circuits may also be configured to provide respective data bits being read from the memory cell array to the respective data input/output pins during a read operation. Moreover, the input/output circuits may be configured to modify operational characteristics thereof responsive to control bits received through the respective data input/output pins during a mode set operation.

Each of the input/output circuits may include an input circuit, an output circuit, and a latch circuit. The input circuit may be configured to accept a data bit from the corresponding data input/output pin being written to the memory cell array during the write operation and to accept a control bit received through the respective data input/output pin during the mode set operation. The output circuit may be configured to provide a data bit being read from the memory cell array to the respective data input/output pin during the read operation. The latch circuit may be configured to latch the control bit accepted by the input circuit during the mode set operation.

More particularly, each input/output circuit may be configured to modify a driver strength of the respective output circuit responsive to the control bit latched in the respective latch circuit. In addition or in an alternative, each of the input/output circuits may be configured to modify a delay of the respective output circuit responsive to the control bit latched in the respective latch circuit. In addition or in another alternative, each of the input/output circuits may be configured to modify a delay of the respective input circuit responsive to the control bit latched in the respective latch circuit.

Each of the input/output circuits may include a respective latch circuit configured to latch the respective control bit received through the respective data input/output pin during the mode set operation. In addition, a mode set decoder may be configured to receive a mode set code during the mode set operation. The mode set decoder may be further configured to generate a latch signal responsive to the mode set code, and the latch circuits may be configured to latch the control bits received through the respective data input/output pins responsive to the latch signal during the mode set operation. The memory device may also include a plurality of address pins. During the write operation, a write address received at the plurality of address pins may define locations of the memory cell array to which the data bits accepted at the input/output circuits are to be written. During the read operation, a read address received at the plurality of address pins may define locations of the memory cell array from which the data bits provided to the data input/output pins are read. During the mode set operation, the mode set code may be received by the mode set decoder through the plurality of address pins.

According to additional embodiments of the present invention, a memory system may include an integrated circuit memory device and a controller coupled to the integrated circuit memory device. The integrated circuit memory device may include a memory cell array, a plurality of data input/output pins, and a plurality of input/output circuits coupled to respective data input/output pins. The input/output circuits may be configured to accept respective data bits from the respective data input/output pins for writing to the memory cell array during a write operation. The input/output circuits may also be configured to provide respective data bits being read from the memory cell array to the respective data input/output pins during a read operation, and the input/output circuits may be configured to modify operational characteristics thereof responsive to respective control bits received through the respective data input/output pins during a mode set operation. The memory controller may be configured to provide data bits to the data input/output pins to be written to the memory cell during the write operation, to accept data bits from the data input/output pins during the read operation, and to provide control bits to the input/output pins during the mode set operation to thereby modify operational characteristics of input/output circuits.

More particularly, the input/output circuits may include respective input circuits, output circuits, and latch circuits. The input circuits may be configured to accept the respective data bits from the respective data input/output pins being written to the memory cell array during the write operation and to accept the respective control bits received through the respective data input/output pins during the mode set operation. The output circuits may be configured to provide the data bits being read from the memory cell array to the respective data input/output pins during the read operation. The latch circuits may be configured to latch the respective control bits accepted by the input circuits during the mode set operation.

The input/output circuits may be configured to modify driver strengths of the respective output circuits responsive to the control bits latched in the respective latch circuits. In an alternative or in addition, the input/output circuits may be configured to modify delays of the respective output circuits responsive to the control bits latched in the respective latch circuits. In another alternative or in addition, the input/output circuits may be configured to modify delays of the respective input circuits responsive to the control bits latched in the respective latch circuit.

The input/output circuits may include respective latch circuits configured to latch the control bits received through the respective data input/output pins during the mode set operation. In addition, a mode set decoder may be configured to receive a mode set code during the mode set operation, and to generate a latch signal responsive to the mode set code. The latch circuits may be configured to latch the control bits received through the respective data input/output pins responsive to the latch signal during the mode set operation. Moreover, the integrated circuit memory device may include a plurality of address pins, and during the write operation, a write address received at the plurality of address pins may define a location of the memory cell array to which the data bits accepted at the input/output circuits are to be written. During the read operation, a read address received at the plurality of address pins may define a location of the memory cell array from which the data bits provided to the data input/output pins are read, and during the mode set operation, the mode set code may be received by the mode set decoder through the plurality of address pins.

The memory system may also include a second integrated circuit memory device having a second memory cell array, a second plurality of data input/output pins, and a second plurality of input/output circuits. The second plurality of input/output circuits may be coupled to respective data input/output pins of the second integrated circuit memory device, and the second plurality of input/output circuits may be configured to accept respective data bits from respective ones of the second plurality of data input/output pins for writing to the second memory cell array during the write operation. In addition, the second plurality of input/output circuits may be configured to provide data bits being read from the second memory cell array to respective ones of the second plurality of data input/output pins during the read operation. The second plurality of input/output circuits may be configured to modify operational characteristics thereof responsive to respective control bits received through the respective data input/output pins during the mode set operation.

According to additional embodiments of the present invention, an integrated circuit memory device may include a memory cell array, a plurality of data input/output pins, and a plurality of input/output circuits coupled between the memory cell array and respective data input/output pins. A method of operating such an integrated circuit memory device may include accepting data bits from the data input/output pins at respective input/output circuits for writing to the memory cell array during a write operation. Data bits may be provided to the data input/output pins from respective input/output circuits, wherein the data bits are read from the memory cell array during a read operation. In addition, an operational characteristic of at least one of the input/output circuits may be modified responsive to a control bit received through the respective data input/output pin during a mode set operation.

More particularly, the input/output circuits may include respective input circuits and respective output circuits. Accepting data bits during the write operation may include accepting the data bits at the respective input circuits, providing the data bits during the read operation may include providing the data bits from the respective output circuits, and modifying the operational characteristic may include accepting the control bit at the respective input circuit.

In addition, the input/output circuits may include respective latch circuits, and modifying the operational characteristic may include latching the control bit in the respective latch circuit. For example, modifying the operational characteristic may include modifying a driver strength of the respective output circuit responsive to the control bit. In addition or in an alternative, modifying the operational characteristic may include modifying a delay of the respective output circuit responsive to the control bit. In addition or in another alternative, modifying the operational characteristic may include modifying a delay of the respective input circuit responsive to the control bit.

The input/output circuits may also include respective latch circuits, and modifying the operational characteristic may include latching the control bit in the respective latch circuit. More particularly, modifying the operational characteristic may include receiving a mode set code during the mode set operation, generating a latch signal responsive to the mode set code, and latching the control bits received through the respective data input/output pins responsive to the latch signal during the mode set operation. The integrated circuit memory device may further include a plurality of address pins. During the write operation, a write address may be received at the plurality of address pins defining a location of the memory cell array to which the data bits are to be written. During the read operation, a read address may be received at the plurality of address pins defining a location of the memory cell array from which the data bits are to be read. During the mode set operation, the mode set code may be received through the plurality of address pins.

According to still additional embodiments of the present invention, an integrated circuit memory device may include a memory cell array, a plurality of data input/output pins, a plurality of input/output circuits, and a plurality of address pins, with the input/output circuits being coupled between the memory cell array and respective data input/output pins. Operating such an integrated circuit memory device may include, during a write operation, providing a write address to the address pins and providing write data to the data input/output pins to be written to the memory cell array, wherein the write address defines a location of the memory cell array to which the write data is written. During a read operation, a read address may be provided through the plurality of address pins, and read data may be accepted from the input/output pins, wherein the read address defines a location of the memory cell array from which the read data is read. During a mode set operation, a mode set code may be provided through the address pins and control bits may be provided to each of the input/output pins. Moreover, each control bit may define an operational characteristic of the respective input/output circuits. The operational characteristic, for example, may be a driver strength and/or a delay of the respective input/output circuits.

According to yet additional embodiments of the present invention, an integrated circuit memory device may include a memory cell array, a plurality of data input pins, and a plurality of input/output circuits coupled to respective data input pins. The input/output circuits may be configured to accept data bits being written to the memory cell array from the respective data input pins during a write operation, and the input/output circuits may be configured to modify operational characteristics thereof responsive to control bits received through the respective data input pins during a mode set operation. In addition, a plurality of data output pins may be coupled to the memory cell array through respective input/output circuits.

The input/output circuits may include respective input circuits, output circuits, and latch circuits. The respective input circuits may be configured to accept data bits from the respective data input pins during the write operation and to accept the control bits from the respective data input pins during the mode set operation. The respective output circuits may be configured to provide data bits being read from the memory cell array to the respective data output pins during a read operation, and the respective latch circuits may be configured to latch the control bits from the respective input circuits during the mode set operation.

For example, the input/output circuits may be configured to modify driver strengths of the respective output circuits responsive to the respective control bits. In addition or in an alternative, the input/output circuits may be configured to modify delays of the respective output circuits responsive to the respective control bits. In addition or in another alternative, the input/output circuits may be configured to modify delays of the respective input circuits responsive to the respective control bits.

The input/output circuits may include respective latch circuits configured to latch the respective control bits accepted during the mode set operation. In addition, a mode set decoder may be configured to receive a mode set code during the mode set operation and to generate a latch signal responsive to the mode set code, and the latch circuits may be configured to latch the respective control bits responsive to the latch signal during the mode set operation. Moreover, a write address received at a plurality of address pins during the write operation may define a location of the memory cell array to which the data bits are to be written, and the mode set code may be received by the mode set decoder through the plurality of address pins during the mode set operation.

According to more embodiments of the present invention, an integrated circuit memory device may include a memory cell array, a plurality of data input pins, and a plurality of input/output circuits coupled between the memory cell array and respective data input pins. Data bits from the data input pins may be accepted at respective input/output circuits for writing to the memory cell array during a write operation, and an operational characteristic of at least one of the input/output circuits may be modified responsive to a control bit received through the respective data input pin during a mode set operation.

The integrated circuit memory device may also include a plurality of data output pins coupled with the memory cell array through respective input/output circuits, and data bits may be provided to data output pins from respective input/output circuits, with the data bits being read from the memory cell array during a read operation. The input/output circuits may include respective input and output circuits, and accepting data bits during the write operation may include accepting the data bits at the respective input circuits. In addition, providing data bits during the read operation may include providing the data bits from the respective output circuits, and modifying an operational characteristic may include accepting the control bit at the respective input circuit during the mode set operation.

Each of the input/output circuits may include a respective latch circuit, and modifying an operational characteristic may include latching the control bit in the respective latch circuit during the mode set operation. Modifying an operational characteristic, for example, may include modifying a driver strength of the respective output circuit responsive to the control bit. In addition or in an alternative, modifying an operational characteristic may include modifying a delay of the respective output circuit responsive to the control bit. In addition or in another alternative, modifying an operational characteristic may include modifying a delay of the respective input circuit responsive to the control bit.

Each of the input/output circuits may include a latch circuit, and modifying an operational characteristic may include latching the control bit in the respective latch circuit. More particularly, modifying an operational characteristic may include receiving a mode set code during the mode set operation, generating a latch signal responsive to the mode set code, and latching control bits received through the respective data input/output circuits responsive to the latch signal during the mode set operation. Moreover, the integrated circuit memory device may include a plurality of address pins, and during the write operation, a write address may be received at the plurality of address pins defining a location of the memory cell array to which the data bits are to be written. During the mode set operation, the mode set code through the plurality of address pins.

BRIEF DESCRIPTION OF THE DRAWINGS

FIG. 3C is a table providing descriptions of memory device pins according to embodiments of the present invention.

DETAILED DESCRIPTION

Figure 1:
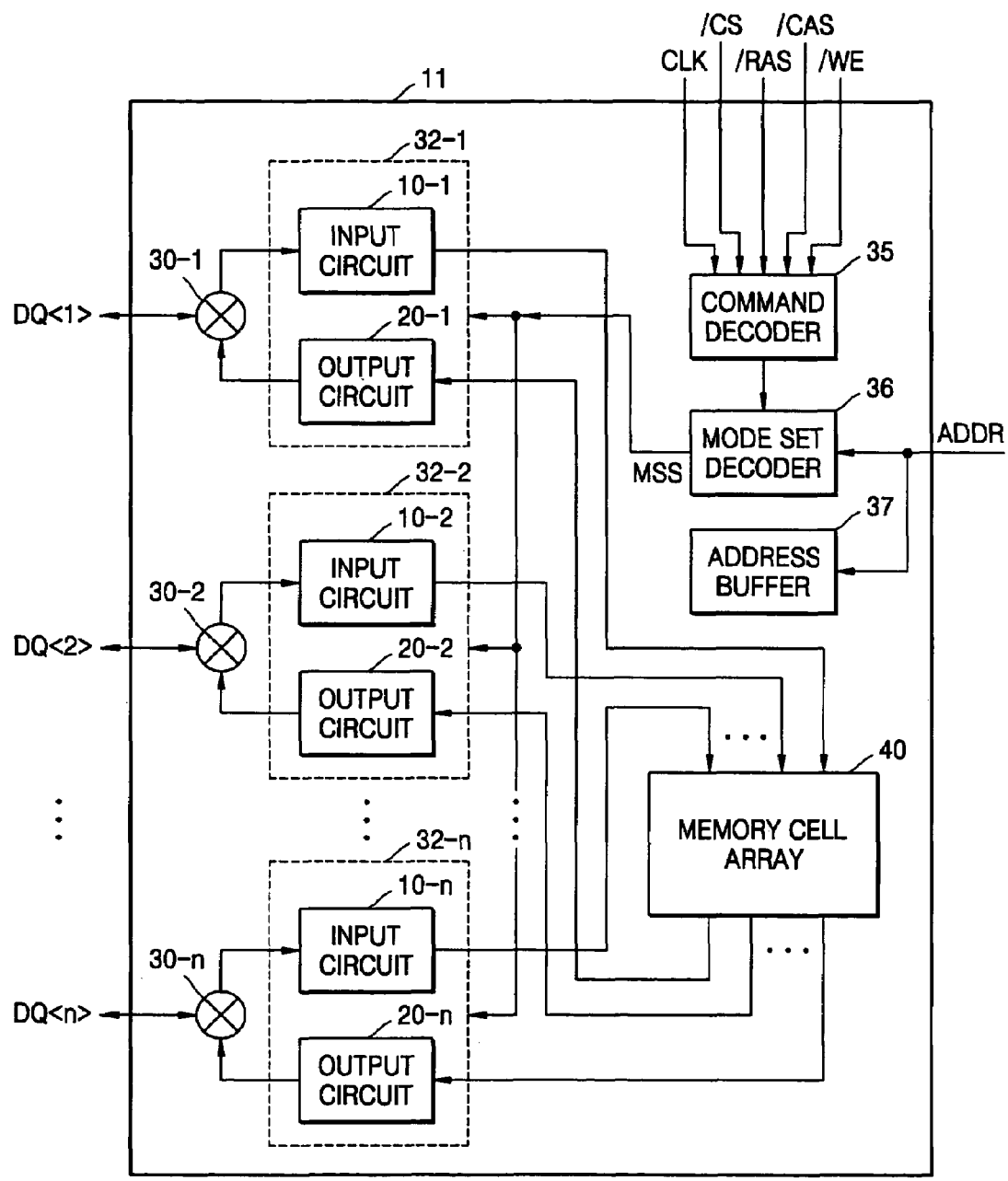
FIG. 1 is a block diagram illustrating a first integrated circuit memory device according to the prior art.
Figure 2:
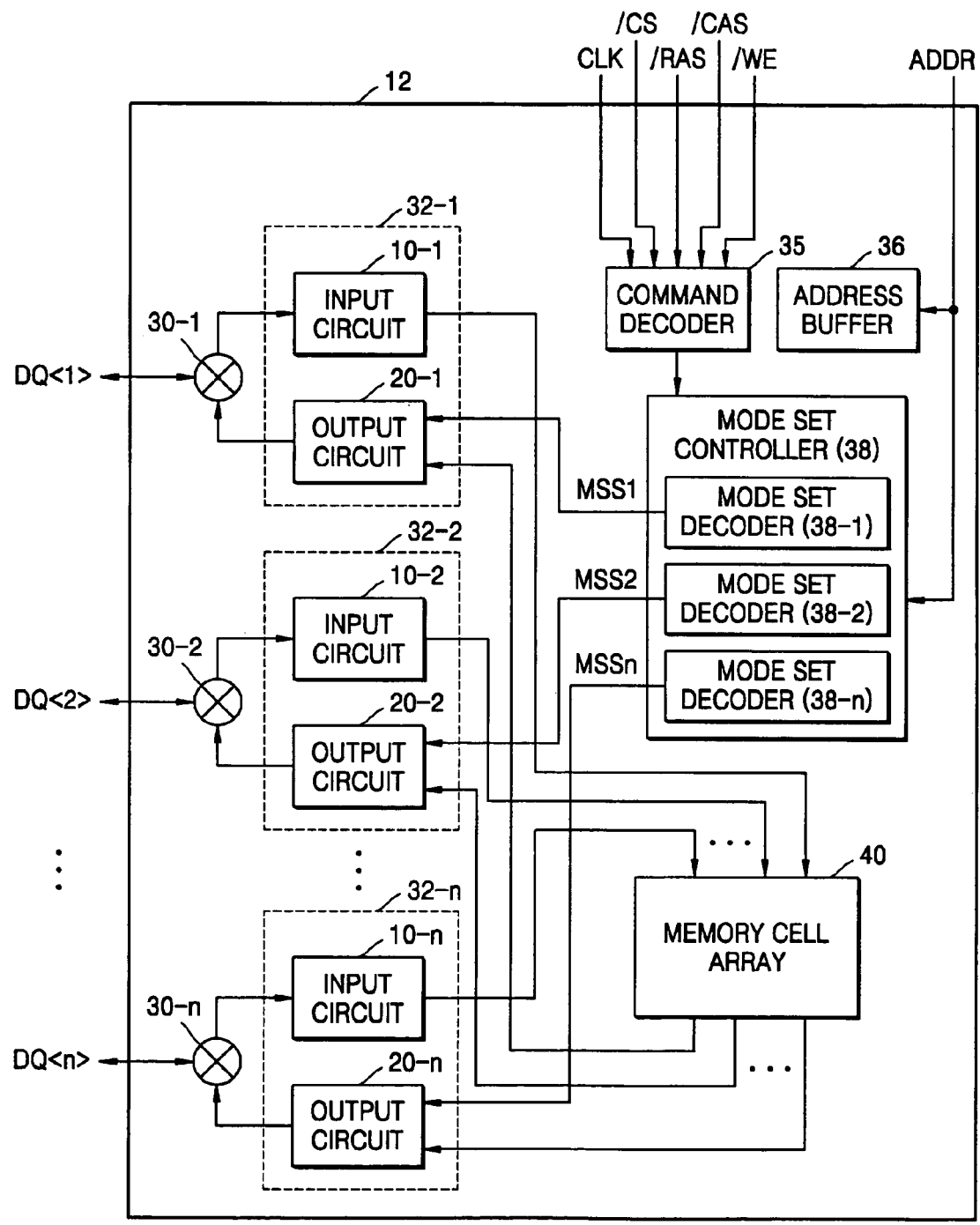
FIG. 2 is a block diagram illustrating a second integrated circuit memory device according to the prior art.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
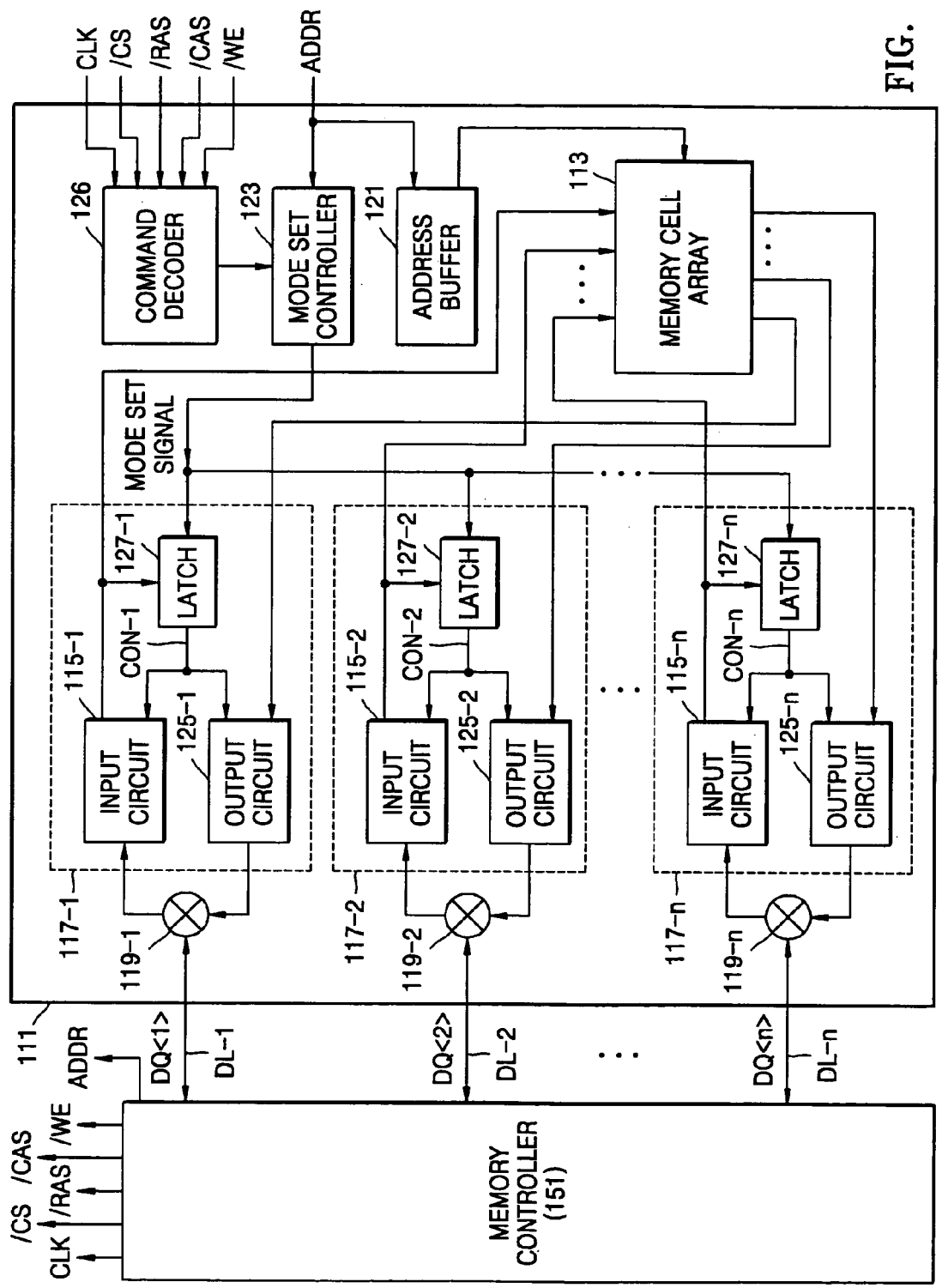
FIG. 3A is a block diagram illustrating integrated circuit memory devices and memory controllers according to embodiments of the present invention.

An integrated circuit memory device 111 according to embodiments of the present invention may include a memory cell array 113, a plurality of input/output buffers 117-1 to 117-n, a plurality of input/output pins 119-1 to 119-n, an address buffer 121, a mode set controller 123, and a command decoder 126, as shown in FIG. 3A. More particularly, the input/output buffers 117-1 to 117-n may include respective input circuits 115-1 to 115-n, output circuits 125-1 to 125-n, and latches 127-1 to 127-n. In addition, the memory cell array 113 may include one or more arrays of memory cells, row decoders, column decoders, and/or sense amplifiers. Moreover, the memory device 111 may be a dynamic random access memory device.

Operations of the memory device 111 may be controlled by a memory controller 151 that generates address signals ADDR, a clock signal CLK, and command signals (such as chip select signal /CS, row address signal /RAS, column address signal /CAS, and write enable signal /WE). During a data write operation, data bits DQ<1> to DQ<n> may be provided from the memory controller 151 over data lines DL-1 to DL-n to respective input/output pins 119-1 to 119-n of the memory device 111. During a data read operation, data bits DQ<1> to DQ<n> may be provided from respective input/output pins 119-1 to 119-n of the memory device 111 over data lines DL-1 to DL-n to the memory controller 151. Moreover, the memory controller 151 may control operations of a plurality of memory devices with the clock signal CLK, the address signals ADDR, and command signals (such as /CS, /RAS, /CAS, and /WE) being provided over respective lines of a clock/command/address bus that is coupled to respective clock/command/address inputs of each of the plurality of memory devices. Separate data lines DL-1 to DL-n, however, may be provided between the memory controller and input/output pins 119-1 to 119-n of each memory device coupled to the memory controller 151 so that data can be written to and read from a plurality of memory devices at the same time responsive to the same clock/command/address signals.

During a write operation, data bits DQ<1> to DQ<n> may be provided over data lines DL-1 to DL-n to respective input/output pins 119-1 to 119-n. Responsive to write command signals received at the command decoder 126 and address signals ADDR received at the address buffer 121, the data bits DQ<1> to DQ<n> are accepted by the respective input circuits 115-1 to 115-n and written to memory cells of the memory cell array 113 corresponding to addresses defined by the address signals ADDR.

A read operation may be initiated responsive to read command signals received at the command decoder 126 and address signals ADDR received at the address buffer 121. Once the read operation is initiated, data bits from memory cells of the memory cell array 113 (corresponding to addresses defined by the address signals ADDR) are provided as data bits DQ<1> to DQ<n> through respective output circuits 125-1 to 125-n, input/output pins 119-1 to 119-n, and data lines DL-1 to DL-n to the memory controller 151.

A mode set operation may be initiated by the memory controller 151 by providing that a mode set command signal (such as providing that command signals /CS, /RAS, /CAS, and /WE are all low), and by providing a mode set code to the mode set controller 123 over lines of the clock/command/address bus used to provide address signals ADDR during read and write operations. The mode set controller 123 may decode different mode set codes defining different operations of the memory device. According to embodiments of the present invention, an input/output characteristic mode set code may be defined to change an operational characteristic of the input/output buffers 117-1 to 117-n responsive to control bits received through the respective input/output pins 119-1 to 119-n during the input/output characteristic mode set operation.

During mode set operations according to some embodiments of the present invention, an input/output characteristic mode set code may be provided to the mode set controller 123, and respective control bits may be provided through data lines DL-1 to DL-n, data pins 119-1 to 119-n, and input circuits 115-1 to 115-n to inputs of the latches 127-1 to 127-n. In response to the input/output characteristic mode set code, the mode set controller 123 may generate a mode set signal that is applied to each of the latches 127-1 to 127-n to latch the respective control bits therein. Each of the latches 127-1 to 127-n generates a respective control signal CON-1 to CON-n responsive to the control bit latched therein. As shown, an operational characteristic of the output circuits 125-1 to 125-n may depend on a value of the respective control signals CON-1 to CON-n, and the control signals CON-1 to CON-n may be applied to respective input circuits 115-1 to 115-n or output circuits 125-1 to 125-n.

For example, the control signals CON-1 to CON-n may be applied to respective output circuits to determine respective driver strengths and/or delays of the output circuits 125-1 to 125-n. In an alternative, the control signals CON-1 to CON-n may be applied to the respective input circuits 115-1 to 115-n to control operational characteristics thereof. For example, the control signals CON-1 to CON-n may determine respective delays of the input circuits 115-1 to 115-n. Moreover, while a single latch circuit 127 and control signal CON are illustrated for each input/output buffer 117, two or more serially coupled latches may be provided for each input/output buffer 117 so that two or more control bits may be serially received during two consecutive mode set operations and so that two or more control signals can be generated to control two or more operational characteristics of each input/output buffer 117. Control bits received at respective input circuits 115-1 to 115-n during a mode set operation according to embodiments of the present invention can thus provide selective modification of operational characteristics of the respective input circuit or an associated output circuit.

Figure 3B:
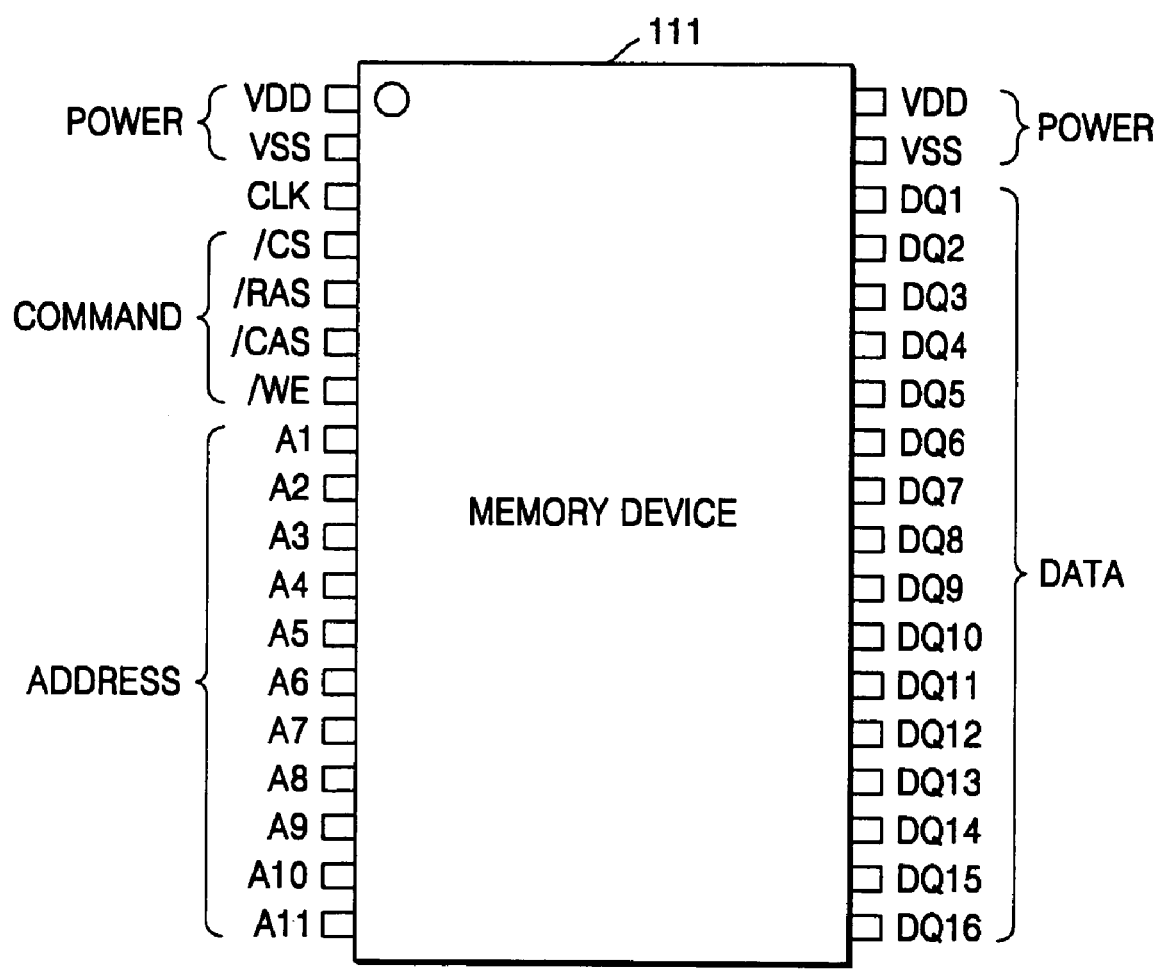
FIG. 3B is a diagram illustrating a pin configuration for memory devices according to embodiments of the present invention.

FIG. 3B is an example of a pin configuration for the memory device 111 of FIG. 3A, and FIG. 3C is a table providing further description of the pins. As shown, the memory device may include two power supply voltage pins VDD, two reference voltage (e.g. ground) pins VSS; clock pin CLK; command pins /CS, /RAS, /CAS, and /WE; eleven address pins A1 to A11; and sixteen data input/output pins DQ1 to DQ16. Command signals may be provided from a memory controller to command pins /CS, /RAS, /CAS, and /WE to define an operation to be performed by the memory device 111. During a write operation, sixteen bits of data may be provided from the memory controller to the data input/output pins DQ1 to DQ16, and the data may be written to memory cells within the memory device 111 defined by an address(es) provided from the memory controller to address pins A1 to A11. During a read operation, sixteen bits of data may be provided from memory cells within the memory device to the data input/output pins DQ1 to DQ16. The memory cells from which data bits are read are defined by an address(es) provided from the memory controller to address pins A1 to A11.

During a mode set operation, data bits received at address pins A1 to A11 may define mode set codes. When a mode set code according to embodiments of the present invention is received at address pins A1 to A11, operational characteristics of input/output buffers associated with respective data pins DQ1 to DQ16 may be controlled responsive to data received at the data pins DQ1 to DQ16 received during the mode set operation.

As used herein, the term pin is defined to include any input or output structure of an integrated circuit memory device providing electrical connectivity to another device, substrate, and/or circuit board. For example, the term pin may include: leads of a dual in-line package (DIP), a single in-line package (SIP), a pin grid array (PGA), quad small outline package (QSOP), etc.; solder bumps of a flip-chip, ball grid array, etc.; wire bonds; bonding pads; etc.

Figure 4:
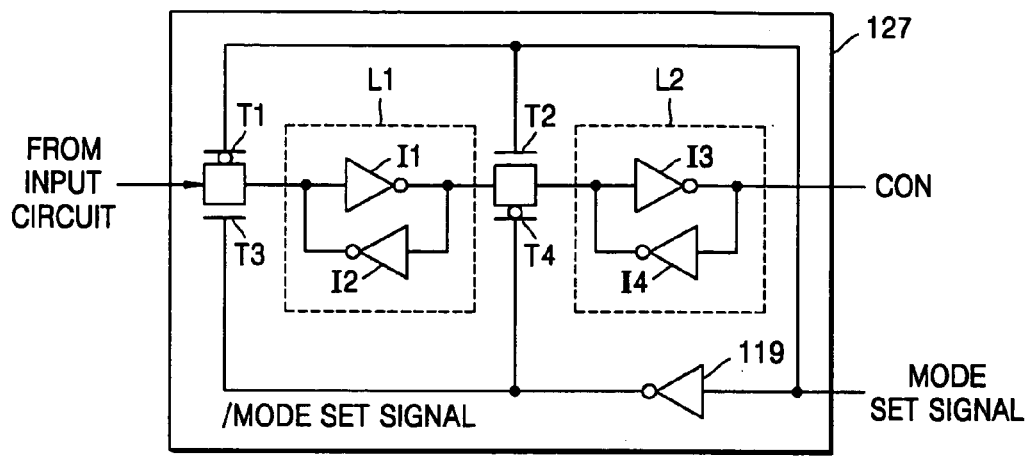
FIG. 4 is a schematic diagram illustrating latches according to embodiments of the present invention.

According to some embodiments of the present invention, each of the latches 127-1 to 127-n may be implemented as illustrated by latch 127 of FIG. 4. As shown, the latch 127 may include NMOS gating transistors T2 and T3; PMOS gating transistors T1 and T4; latching circuit L1 including inverters I1 and I2; latching circuit L2 including inverters I3 and I4; and inverter 119. During a mode set operation according to embodiments of the present invention, a control bit from the input circuit 115 is initially provided at the gating transistors T1 and T3 while the mode set signal is at a logic low state so that an inverse of the logic state of the control bit is generated at the output of the latching circuit L2 including inverters I3 and I4. While maintaining the control bit at the gating transistors T1 and T3, the mode set signal is switched to a logic high state so that the gating transistors T1 and T3 are turned off and the gating transistors T2 and T4 are turned on. Accordingly, the output of latching circuit L1 is transmitted to the input of latching circuit L2, and the logic state of the control bit is provided as the control signal CON at the output of the latching circuit L2. When the mode set operation is complete, the mode set signal may be restored to a low logic state, and the control signal CON will remain latched at the output of latching circuit L2.

As long as the mode set signal is at a low logic state, the gating transistors T1 and T3 are on and the gating transistors T2 and T4 are off so that the control signal CON remains latched at the output of the latching circuit L2 regardless of the input from the input circuit. By transitioning the mode set signal from a low logic state to a high logic state and back to a low logic state, a new control bit from the input circuit may be latched as the control signal CON. Accordingly, a first operational characteristic for the input/output buffer may be provided responsive to a low logic state of the control signal CON, and a second operational characteristic for the input/output buffer may be provide responsive to a high logic state of the control signal CON. For example, a first or second delay of the respective output circuit may be selected depending on the logic state of the control signal CON. In an alternative or in addition, a first or second driver strength of the respective output circuit may be selected depending on the logic state of the control signal CON. In another alternative or in addition, a first or second delay of the respective input circuit may be selected depending on the logic state of the control signal CON. Moreover, operational characteristics for each of the input/output buffers 117-1 to 117-$n$ may be separately determined during a same mode set operation because the control bits are separately provided from the memory controller 151 to input circuits 115-1 to 115-$n$ of each of the input/output buffers 117-1 to 117-$n$.

Figure 5:
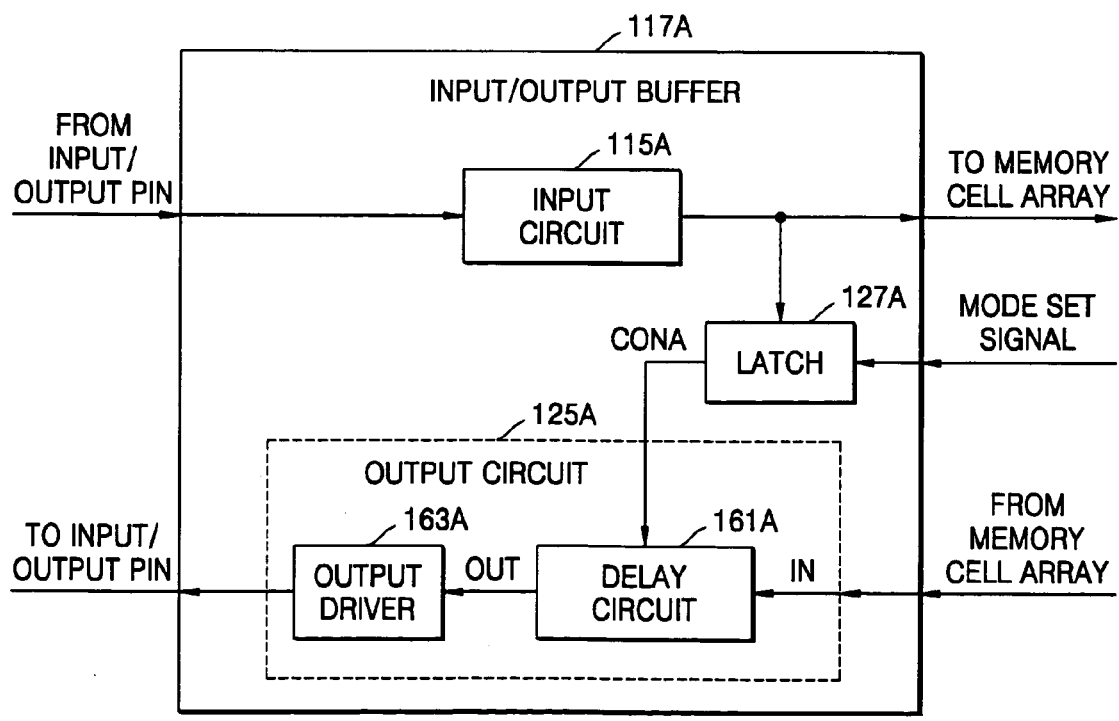
FIG. 5 is a block diagram illustrating input/output buffers according to embodiments of the present invention.

According to particular embodiments of the present invention, each of the input/output buffers 117-1 to 117-$n$ may be implemented as illustrated by input/output buffer 117A of FIG. 5. The input/output buffer 117A, for example, may include input circuit 115A, latch 127A, and output circuit 125A, and the output circuit 125A may include delay circuit 161A and output driver 163A. As further shown in FIG. 5, the control signal CONA generated by the latch 127A may be applied to the delay circuit 161A to control a delay thereof. Moreover, the latch 127A may be implemented as discussed above with respect to FIG. 4.

During a mode set operation, a control bit may be provided through an input/output pin and input circuit 115A to the latch 127A, and the control bit may be latched in the latch 127A responsive to a mode set signal from the mode set controller 123. A control signal CONA may be generated by the latch 127A responsive to the control bit latched therein, and different delays of the delay circuit 161A may be provided responsive to different values of the control signal CONA. The delay circuit 161A may be implemented as illustrated, for example, in FIGS. 6A–C.

Figure 6A:
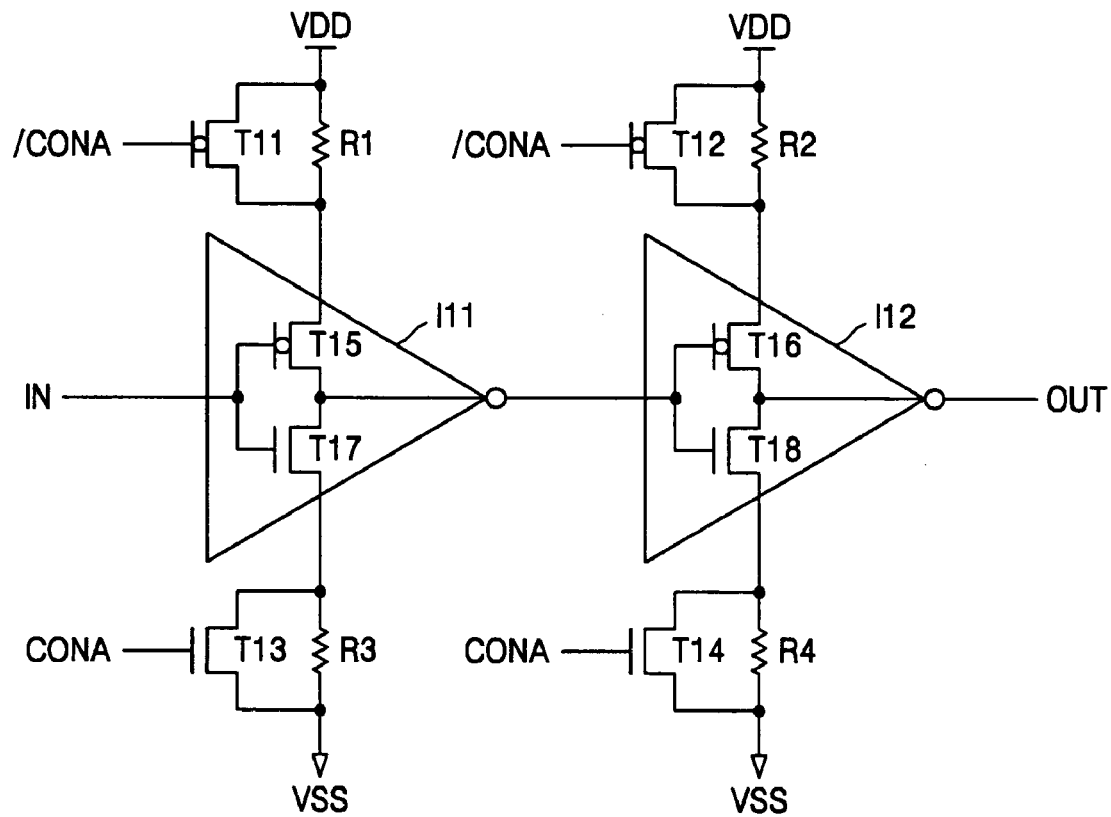
FIGS. 6A–C are schematic diagrams illustrating delay circuits according to embodiments of the present invention.

The delay circuit 161A, for example, may be implemented as illustrated in FIG. 6A. In particular, inverter I11 (including pull-up transistor T15 and pull-down, transistor T17) and inverter I12 (including pull-up transistor T15 and pull-down transistor T17) may be serially coupled between the input IN and output OUT of the delay circuit 161A. Each of the inverters I11 and I12 may provide some propagation delay of signals there through, and these propagation delays may be varied using load circuits including transistors T11, T12, T13, and T14 and load resistors R1, R2, R3, and R4. In addition, a capacitor(s) may be provided in parallel with one or more of the load resistors R1, R2, R3, and R4.

More particularly, a relatively short delay may be provided by providing a control signal CONA having a high logic state so that transistors T11, T12, T13, and T14 are turned on thereby bypassing load resistors R1, R2, R3, and R4. By bypassing the load resistors R1, R2, R3, and R4, an RC (resistor-capacitor) time constant can be reduced thereby reducing delay. A relatively long delay may be provided by providing a control signal CONA having a low logic state so that transistors T11, T12, T13, and T14 are turned off and load resistors R1, R2, R3, and R4 are coupled between the inverters I11 and I12 and power supply VDD and reference VSS voltages. By coupling the load resistors R1, R2, R3, and R4 between the inverters I11 and I12 and power supply VDD, an RC time constant of the delay circuit can be increase thereby increasing delay. The control signal inverse /CONA may be provided by inverting the control signal CONA using an inverter.

Figure 6B:
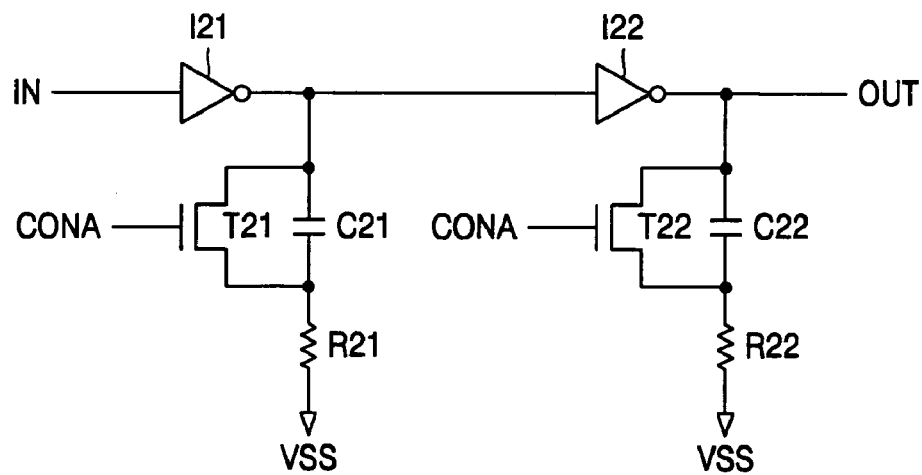

In an alternative, the delay circuit 161A may be implemented as illustrated in FIG. 6B. In particular, inverters I21 and I22 may be serially coupled between the input IN and output OUT of the delay circuit 161A. Each of the inverters I21 and I22 may provide some propagation delay of signals there through, and these propagation delays may be varied using load circuits including transistors T21 and T22, load capacitors C21 and C22, and load resistors R21 and R22. In addition, a resistor(s) may be provided in parallel with one or more of the load capacitors C21 and C22.

More particularly, a relatively short delay may be provided by providing a control signal CONA having a high logic state so that transistors T21 and T22 are turned on thereby bypassing load capacitors C21 and C22. By bypassing the load capacitors C21 and C22, an RC time constant can be reduced thereby reducing delay. A relatively long delay can be provided by providing a control signal CONA having a low logic state so that transistors T21 and T22 are turned off and load capacitors C21 and C22 are coupled in series with load resistors R21 and R22 between outputs of inverters I21 and I22 and reference voltage VSS. By coupling the load capacitors C21 and C22 in series with load resistors R21 and R22 between outputs of inverters I21 and I22 and reference voltage VSS, an RC time constant can be increased thereby increasing delay.

Figure 6C:
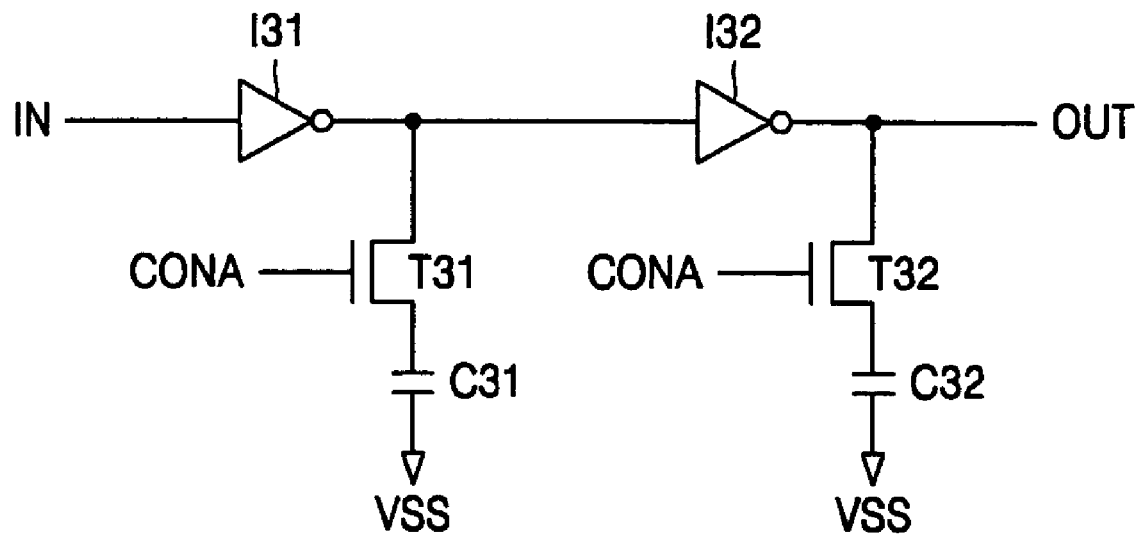

In another alternative, the delay circuit 161A may be implemented as illustrated in FIG. 6C. In particular, inverters I31 and I32 may be serially coupled between the input IN and output OUT of the delay circuit 161A. Each of the inverters I31 and I32 may provide some propagation delay of signals there through, and these propagation delays may be varied using load circuits including transistors T31 and T32 and load capacitors C31 and C32. In addition, a resistor(s) may be provided in series and/or parallel with one or more of the load capacitors C31 and C32.

More particularly, a relatively short delay may be provided by providing a control signal CONA having a logic state so that transistors T31 and T32 are turned off thereby decoupling load capacitors C31 and C32 from outputs of inverters I31 and I32. By decoupling the load capacitors C31 and C32, an RC time constant can be reduced thereby reducing delay. A relatively long delay can be provided by providing a control signal CONA having a high logic state so that transistors T31 and T32 are turned on and load capacitors C31 and C32 are coupled between outputs of inverters I31 and I32 and reference voltage VSS. By coupling the load capacitors C31 and C32 between outputs of inverters I31 and I32 and reference voltage VSS, an RC time constant can be increased thereby increasing delay.

Figure 6D:
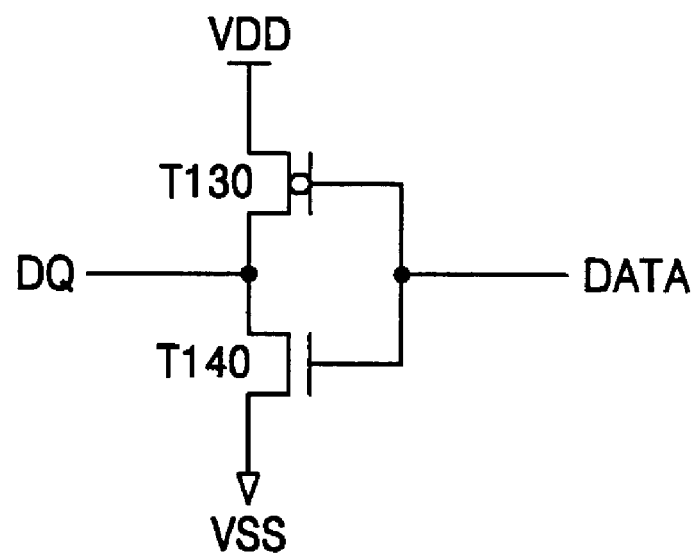
FIG. 6D is a schematic diagram illustrating output drivers.

The output driver 163A may be implemented using a driver circuit as illustrated, for example, in FIG. 6D. In particular, the driver circuit may include a pull-up transistor T130 and a pull-down transistor T140 serially coupled between supply voltage VDD and reference voltage VSS. Moreover, a data signal DATA from the delay circuit 161A is provided to inputs (e.g. gate electrodes) of the transistors T130 and T140 so that the output signal DQ is inverted relative to the data signal DATA. While one driver circuit (including one pull-up transistor and one pull-down transistor) is illustrated in FIG. 6D, the output driver 163A may include two or more serially coupled output drivers.

Figure 7:
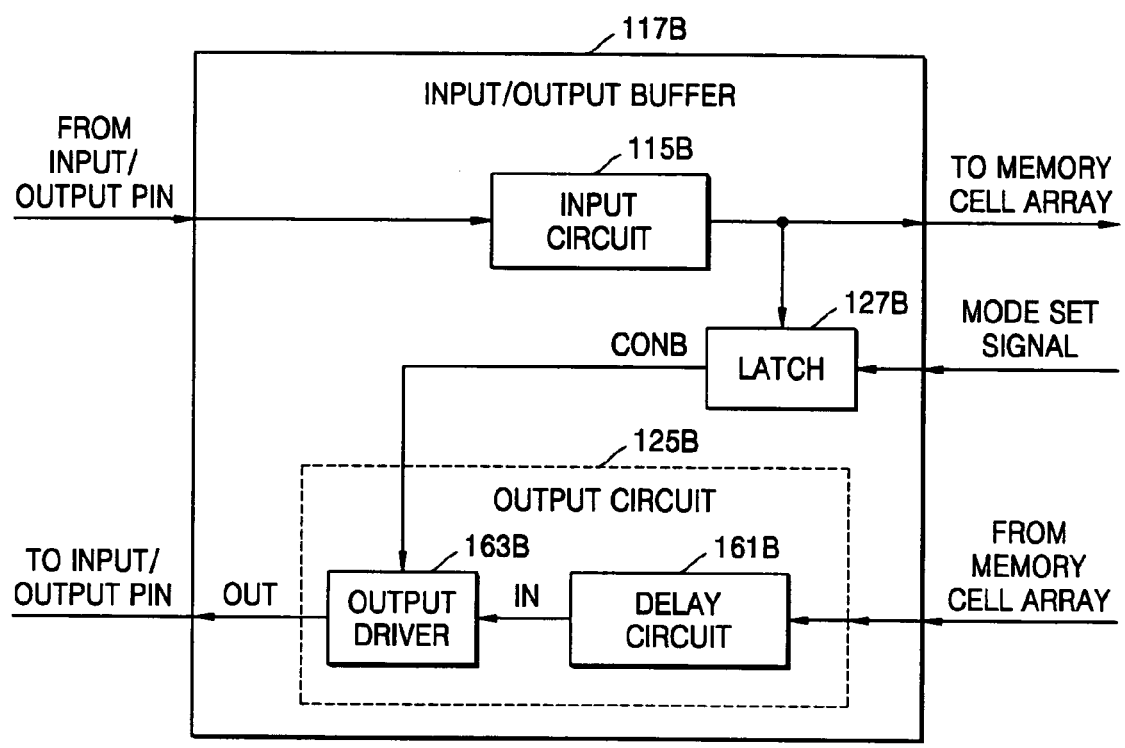
FIG. 7 is a block diagram of input/output buffers according to additional embodiments of the present invention.

According to additional embodiments of the present invention, each of the input/output buffers 117-1 to 117-*n* may be implemented as illustrated by input/output buffer 117B of FIG. 7. The input/output buffer 117B, for example, may include input circuit 115B, latch 127B, and output circuit 125B, and the output circuit 125B may include delay circuit 161B and output driver 163B. As further shown in FIG. 7, the control signal CONB generated by the latch 127B may be applied to the delay circuit 161B to control a delay thereof. Moreover, the latch 127B may be implemented as discussed above with respect to FIG. 4.

During a mode set operation, a control bit may be provided through an input/output pin and input circuit 115B to the latch 127B, and the control bit may be latched in the latch 127B responsive to a mode set signal from the mode set controller 123. A control signal CONB may be generated by the latch 127B responsive to the control bit latched therein, and different driver strengths of the driver circuit 163B may be provided responsive to different values of the control signal CONB.

Figure 8A:
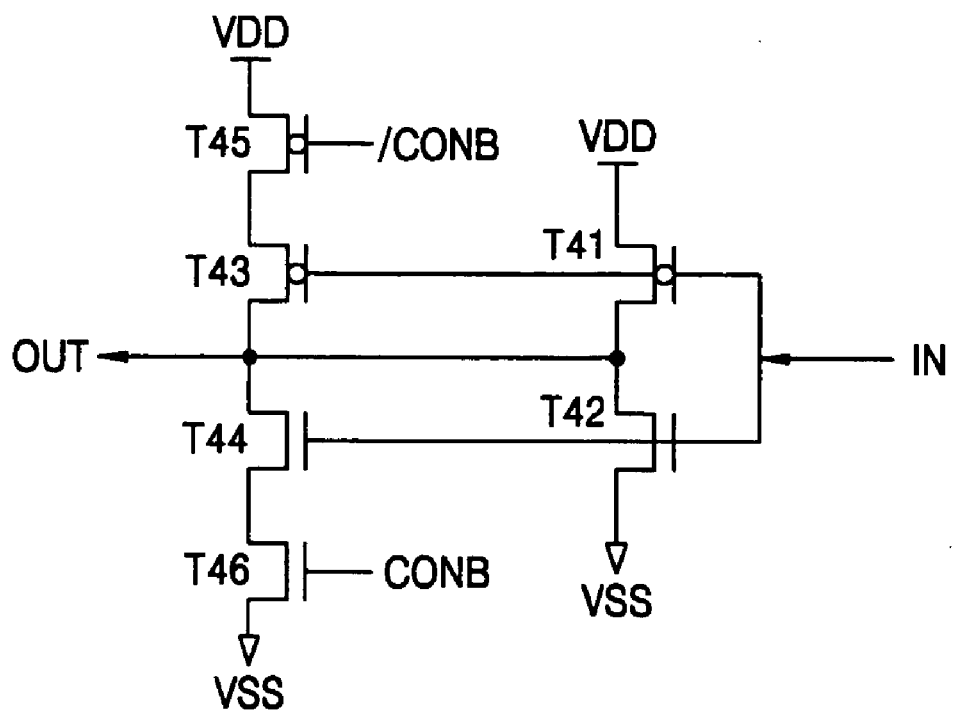
FIG. 8A is a schematic diagram illustrating driver circuits according to embodiments of the present invention.

The driver circuit 163B may be implemented as illustrated in FIG. 8, for example. In particular, the driver circuit of FIG. 8A may include a primary driver circuit with pull-up transistor T41 and pull-down transistor T42; and a supplemental driver circuit with pull-up transistor T43, pull-down transistor T44, and enable/disable transistors T45 and T46. A relatively low driver strength may be provided by providing a control signal CONB having a low logic state so that enable/disable transistors T45 and T46 are turned off and the pull-up and pull-down transistors T43 and T44 are decoupled from power supply voltage VDD and reference voltage VSS. A relatively high driver strength may be provided by providing a control signal CONB having a high logic state so that enable/disable transistors T45 and T46 are turned on and the pull-up and pull-down transistors T43 and T44 are respectively coupled with power supply voltage VDD and reference voltage VSS. The control signal inverse /CONB may be provided by inverting the control signal CONB using an inverter.

With a control signal CONB having a low logic state, enable/disable transistors T45 and T46 are turned off and the pull-up and pull-down transistors T43 and T44 are decoupled from power supply voltage VDD and reference voltage VSS. Accordingly, an input signal IN having a low logic state will turn on pull-up transistor T41 and turn off pull-down transistor T42 so that the output signal OUT is pulled up to the supply voltage VDD through pull-up transistor T41. While the pull-up transistor T43 may also be turned on, the enable/disable transistor T45 is turned off so that current does not flow through pull-up transistor T43. An input signal IN having a high logic state will turn off pull-up transistor T41 and turn on pull-down transistor T42 so that the output signal OUT is pulled down to the reference voltage VSS through pull-down transistor T42. While the pull-down transistor T44 may also be turned on, the enable/disable transistor T46 is turned off so that current does not flow through pull-down transistor T44. With a control signal CONB having a low logic state, the supplemental driver circuit (including transistors T43, T44, T45, and T46) may thus be disabled.

With a control signal CONB having a high logic state, enable/disable transistors T45 and T46 are turned on so that the pull-up and pull-down transistors T43 and T44 are respectively coupled with power supply voltage VDD and reference voltage VSS. Accordingly, an input signal IN having a low logic state will turn on pull-up transistors T41 and T43 and turn off pull-down transistors T42 and T44 so that the output signal OUT is pulled up to the supply voltage VDD through pull-up transistors T41 and T43 and enable/disable transistor T45. An input signal IN having a high logic state will turn off pull-up transistors T41 and T43 and turn on pull-down transistors T42 and T44 so that the output signal OUT is pulled down to the reference voltage VSS through pull-down transistors T42 and T44 and enable/disable transistor T46. With a control signal CONB having a high logic state, the supplemental driver circuit (including transistors T43, T44, T45, and T46) may thus be enabled thereby increasing a driver strength of the output driver.

More particularly, a strength of the output driver of FIG. 8A may be a function of channel widths of transistors of the primary and supplemental driver circuits. For example, the pull-up and pull-down transistors T41 and T42 of the primary driver circuit may have relatively narrow channel widths to provide relatively a relatively low current capacity, and the transistors T43, T44, T45, and T46 of the supplemental driver circuit may have relative wide channel widths to provide relatively high current capacity. Accordingly, the output driver may provide a relatively high driver strength when the supplemental driver circuit is enabled, and a relatively low driver strength when the supplemental driver circuit is disabled.

Figure 8B:
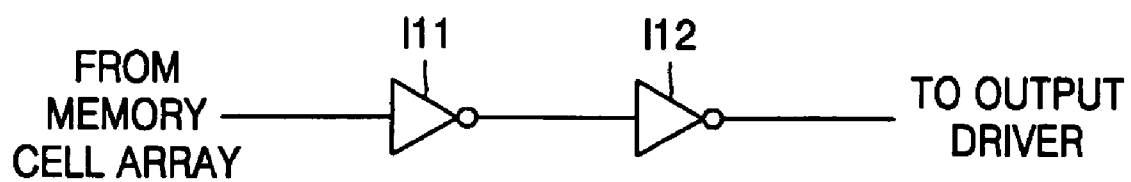
FIG. 8B is a schematic diagram illustrating delay circuits.

The delay circuit 161B may be implemented using a delay circuit as illustrated, for example, in FIG. 8B. In particular, the delay circuit may include two or more serially coupled inverters I111 and I112. Each inverter may provide a propagation delay for signals transmitted there through. While two inverters are shown, the delay circuit 161B may include one inverter, or more than two inverters may be included.

Figure 9:
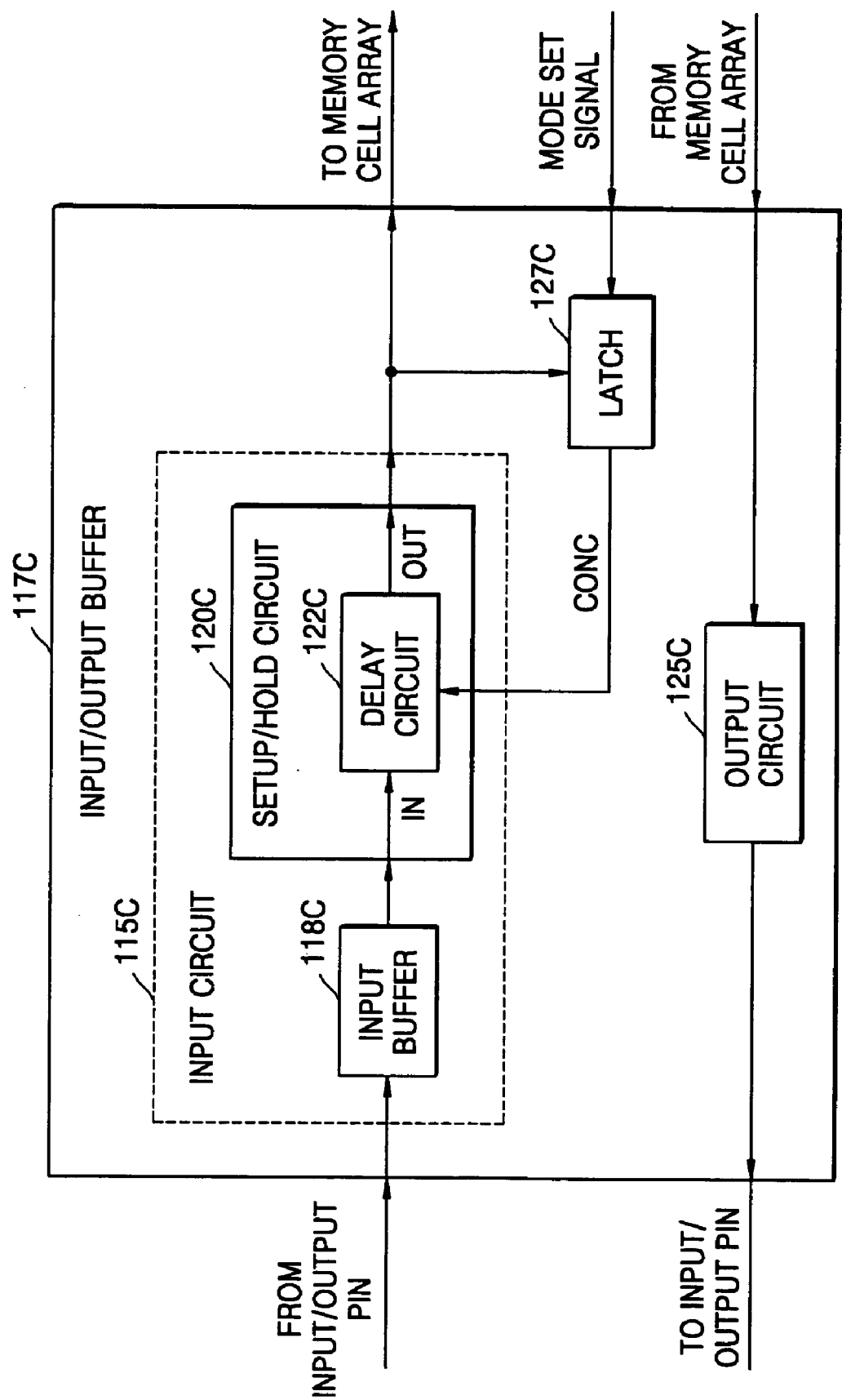
FIG. 9 is a block diagram illustrating input/output buffers according to still additional embodiments of the present invention.

According to still additional embodiments of the present invention, each of the input/output buffers 117-1 to 117-*n* may be implemented as illustrated by input/output buffer 117C of FIG. 9. The input/output buffer 117C, for example, may include input circuit 115C, latch 127C, and output circuit 125C, and the input circuit 115C may include input buffer 118C and setup/hold circuit 120C. More particularly, the setup/hold circuit 120C may include a delay circuit 122C. As further shown in FIG. 9, the control signal CONC generated by the latch 127C may be applied to the delay circuit 122C to control a delay thereof. Moreover, the latch 127C may be implemented as discussed above with respect to FIG. 4.

During a mode set operation, a control bit may be provided through an input/output pin and input circuit 115C to the latch 127C, and the control bit may be latched in the latch 127C responsive to a mode set signal from the mode set controller 123. A control signal CONC may be generated by the latch 127C responsive to the control bit latched therein, and different delays of the delay circuit 122C may be provided responsive to different values of the control signal CONC. The delay circuit 122C may be implemented and delays thereof varied as discussed above with regard to FIGS. 6A–C.

Figure 10:
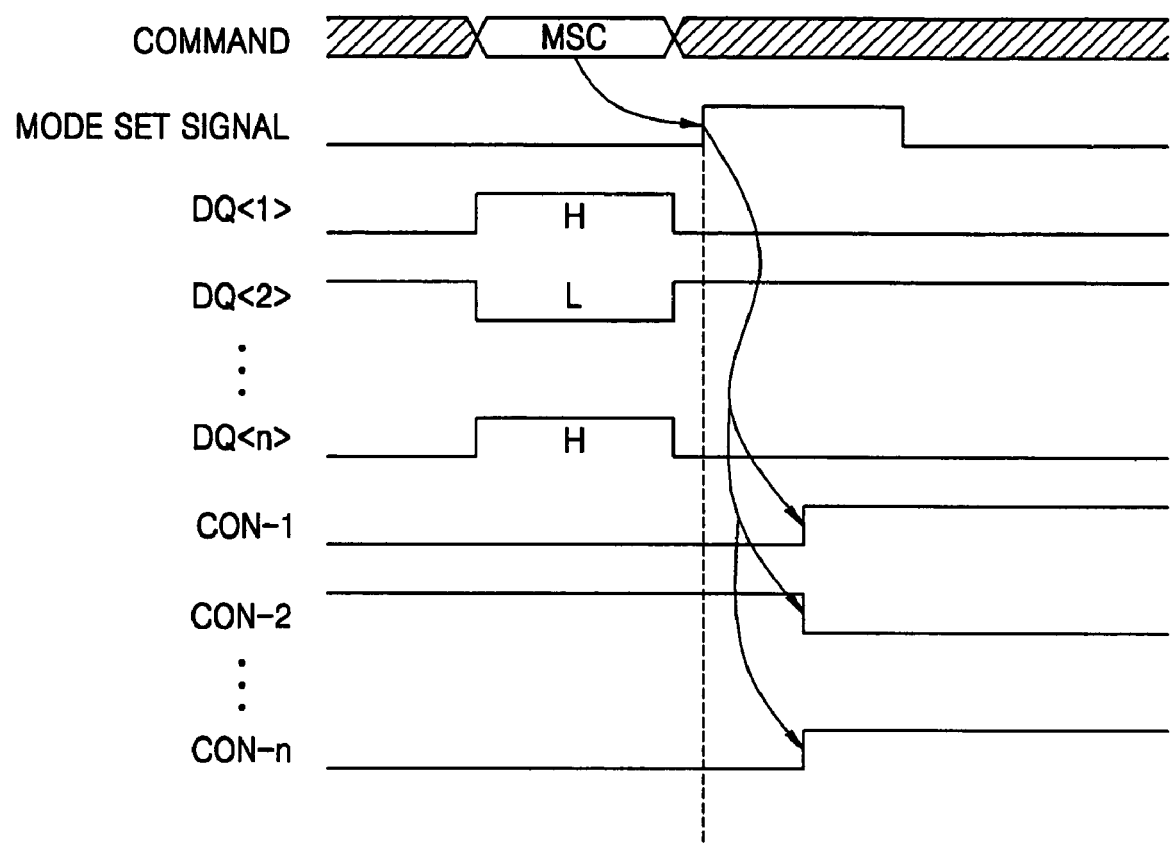
FIG. 10 is a timing diagram illustrating mode set operations according to embodiments of the present invention.

A timing diagram of a mode set operation according to embodiments of the present invention is illustrated in FIG. 10. As shown, a mode set operation may be initiated by providing each of the command signals /CS, /RAS, /CAS, and /WE may be provided to the command decoder 126 at a low logic state and a mode set code MSC may be provided to the mode set controller 123. At the same time the mode set code is applied, control signals (i.e. control bits) may be applied as data signals DQ<1> to DQ<n>. On receipt of the mode set code MSC, the mode set controller 123 generates the mode set signal that is applied to each of the latches 127-1 to 127-n.

As shown, there may be an internal propagation delay from the time the mode set code MSC is received at the mode set controller 123 and the mode set signal is received at the latches 127-1 to 127-n. In addition, there may be a similar delay through the input circuits 115-1 to 115-n from the time that the control bits are applied as data signals DQ<1> to DQ<n> till the control bits are applied to the latches 127-1 to 127-n. Accordingly, the control bits and the mode set code may be applied to the latches at the same time so that the control bits are latched into the respective latches to provide the control signals CON-1 to CON-n. As illustrated in FIG. 10, control bits may be latched for each of the input/output buffers 117-1 to 117-n during a single mode set operation, and different control signal values may be latched for different input/output buffers during the single mode set operation.

Figure 11:
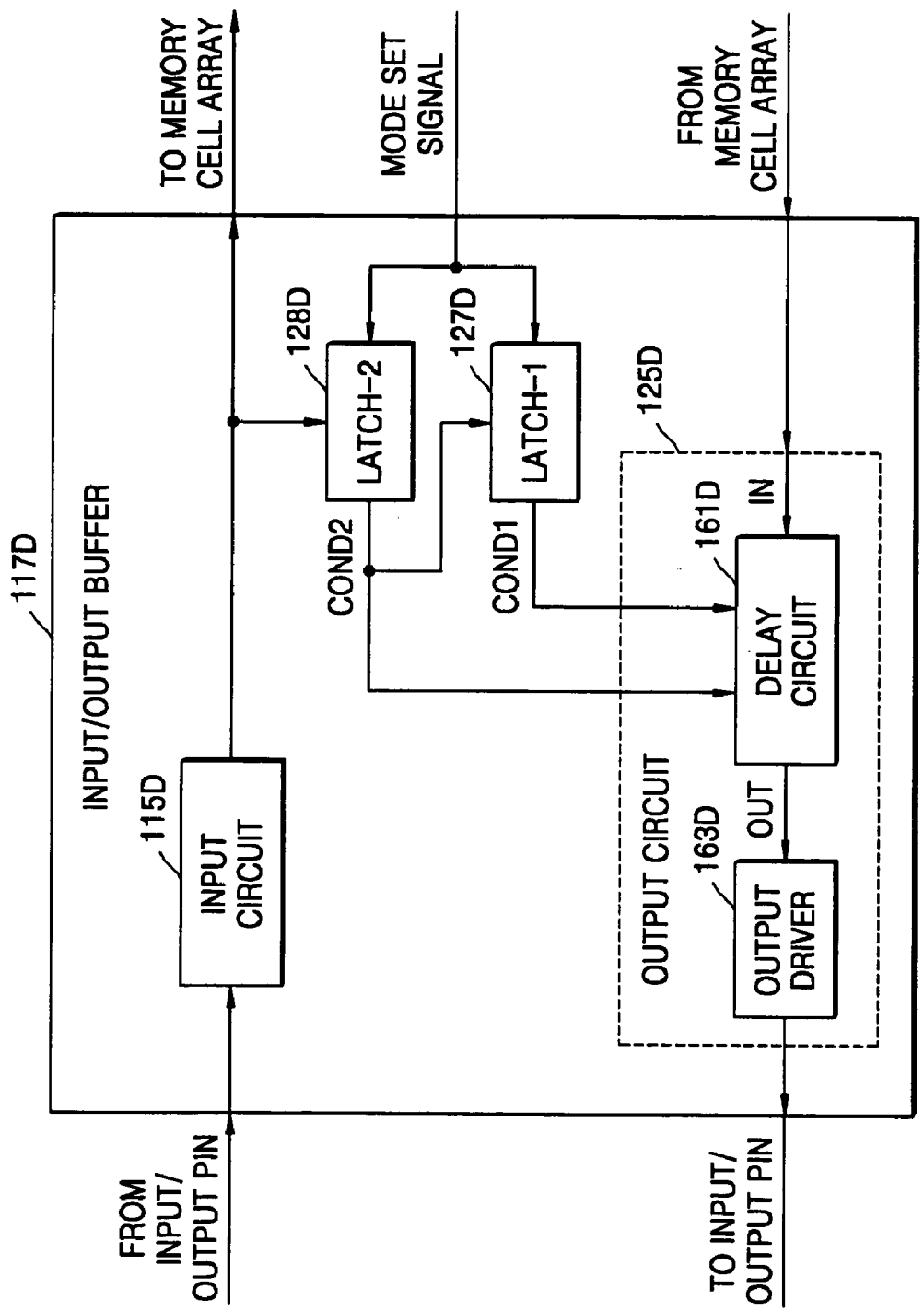
FIG. 11 is a block diagram illustrating input/output buffers according to yet additional embodiments of the present invention.

According to particular embodiments of the present invention, each of the input/output buffers 117-1 to 117-n may be implemented as illustrated by input/output buffer 117D of FIG. 11. The input/output buffer 117D, for example, may include input circuit 115D, output circuit 125D, and two serially coupled latches 127D and 128D. Moreover, the output circuit 125D may include delay circuit 161D and output driver 163D. As further shown in FIG. 11, the latches 127D and 128D generate respective control signals COND1 and COND2 that may be used to provide two bit control of the delay circuit 161D. For example, one of four delay periods may be available responsive to the control signals COND1 and COND2. Moreover, each of the serially connected latches 127D and 128D may be implemented as discussed above with respect to FIG. 4, and the same mode set signal may be applied to both latches.

During a mode set operation, a first control bit may be provided through an input/output pin and input circuit 115D to the latch 128D, and the first control bit may be latched in the latch 128D responsive to first mode set signal from the mode set controller 123. A second control bit may then be provided though the input/output pin and input circuit 115D to the latch 128D. Responsive to a second mode set signal from the mode set controller 123, the first control bit from the latch 128D may be latched in latch 127D, and the second control bit from the input circuit 115D may be latched in the latch 128D. Accordingly, after the two mode set operations, the first control bit may be latched in the latch 127D to provide the first control signal COND1, and the second control bit may be latched in the latch 128D to provide the second control signal COND2.

Figure 12:
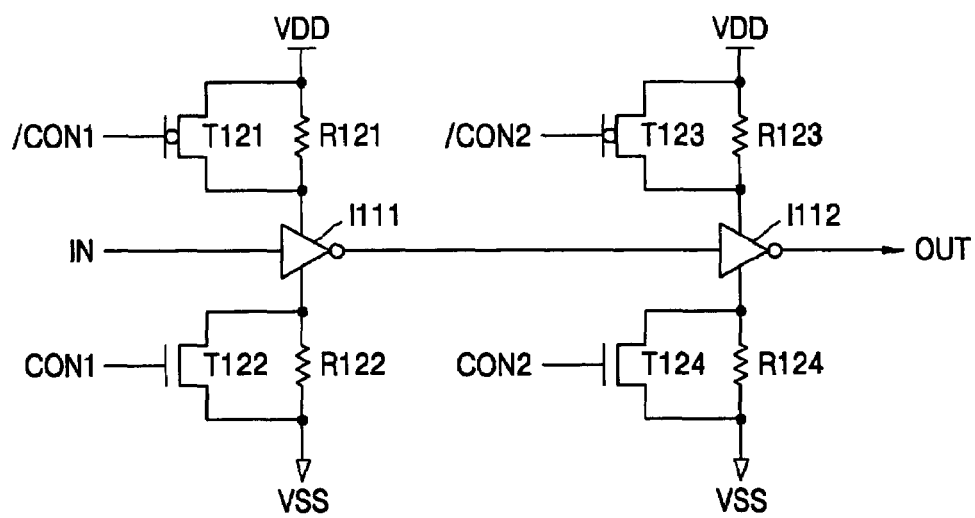
FIG. 12 is a schematic diagram illustrating delay circuits according to embodiments of the present invention.

The delay circuit 161D, for example, may be implemented as illustrated in FIG. 12. In particular, inverter I111 and inverter I112 may be serially coupled between the input IN and output OUT of the delay circuit 161D. Each of the inverters I111 and I112 may provide some propagation delay of signals therethrough, and these propagation delays may be varied using load circuits including transistors T121, T122, T123, and T124 and load resistors R121, R122, R123, and R124. In addition, a capacitor(s) may be provided in parallel with one or more of the load resistors R121, R122, R123, and R124.

More particularly, a relatively short delay may be provided for inverter I111 by providing control signal COND1 at a high logic state so that transistors T121 and T122 are turned on thereby bypassing load resistors R121 and R122. By bypassing the load resistors R121 and R122, an RC (resistor-capacitor) time constant can be reduced, thereby reducing delay. A relatively long delay may be provided for inverter I111 by providing control signal COND1 at a low logic state so that transistors T121 and T122 are turned off thereby coupling load resistors R121 and R122 between the inverter and the supply and reference voltages VDD and VSS. By coupling the load resistors R121 and R122 between the inverter I111 and power supply and reference voltages VDD and VSS, an RC time constant of the delay circuit can be increased thereby increasing delay. The control signal inverse /COND1 may be provided by inverting the control signal COND1 using an inverter.

Similarly, a relatively short delay may be provided for inverter I112 by providing control signal COND2 at a high logic state so that transistors T123 and T124 are turned on thereby bypassing load resistors R123 and R124. By bypassing the load resistors R123 and R124, an RC (resistor-capacitor) time constant can be reduced thereby reducing delay. A relatively long delay may be provided for inverter I112 by providing control signal COND2 at a low logic state so that transistors T123 and T124 are turned off thereby coupling load resistors R123 and R124 between the inverter and the supply and reference voltages VDD and VSS. By coupling the load resistors R123 and R124 between the inverter I112 and power supply and reference voltages VDD and VSS, an RC time constant of the delay circuit can be increased thereby increasing delay. The control signal inverse /COND2 may be provided by inverting the control signal COND2 using an inverter.

By providing that inverters I111 and I112 and/or by providing that resistors R121 and R122 and resistors R123 and R124 have different values, four different delays may be selected using control signals COND1 and COND2. In addition, a capacitor(s) may be provided in parallel with one or more of the resistors R121, R122, R123, and R124. Moreover, a delay circuit of FIG. 6B may be used with the control signals COND1 and COND2 being respectively provided to inputs of transistors T21 and T22. A delay circuit of FIG. 6C may be used with the control signals COND1 and COND2 being respectively provided to inputs of transistors T31 and T32.

Figure 13:
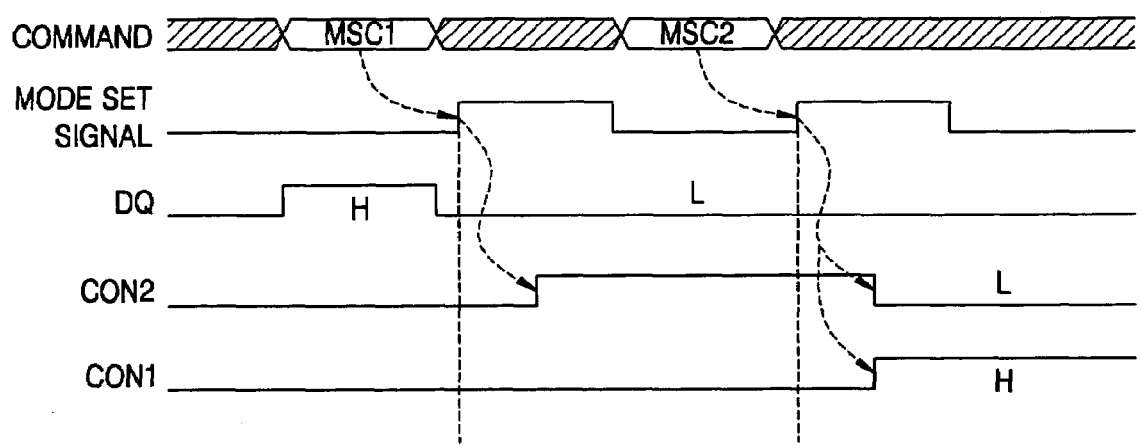
FIG. 13 is a timing diagram illustrating mode set operations according to embodiments of the present invention.

FIG. 13 is a timing diagram illustrating a mode set operation according to embodiments of the present invention including two latches in an input/output buffer as discussed above with respect to FIG. 1. A mode set operation may be initiated by providing each of the command signals /CS, /RAS, /CAS, and /WE to the command decoder 126 at a low logic state and a first mode set code MSC1 may be provided to the mode set controller 123. At the same time the first mode set code is applied, a first control signal (i.e. control bit) may be applied as data signal DQ to input circuit 115D. In the example of FIG. 13, the first control signal is at a high logic state H. On receipt of the first mode set code MSC1, the mode set controller 123 generates the mode set signal that is applied to each of the latches 127D and 128D.

As shown, there may be an internal propagation delay from the time the first mode set code MSC1 is received at the mode set controller 123 and the mode set signal is received at the latches 127D and 128D. In addition, there may be a similar delay through the input circuit 115D from the time that the first control bit is applied as data signal DQ till the first control bit is applied to the latch 128D. Accordingly, the first control bit and the first mode set code MSC1 may be applied to the latch 128D at the same time so that the first control bit is latched into the latch 128D to provide that the control signal COND2 is initially set by the first control bit. As shown, the control signal COND2 is applied as the input of latch 127D.

A second mode set code MSC2 (with the same coding as the first mode set code MSC1) may be provided to the mode set controller 123, and a second control signal (i.e. control bit) may be applied as data signal DQ to input circuit 115D at the same time. In the example of FIG. 13, the second control signal is at a low logic state L. On receipt of the second mode set code MSC2, the mode set controller 123 generates the mode set signal that is applied to each of the latches 127D and 128D.

As shown, there may be an internal propagation delay from the time the second mode set code MSC2 is received at the mode set controller 123 and the mode set signal is received at the latches 127D and 128D. In addition, there may be a similar delay through the input circuit 115D from the time that the second control bit is applied as data signal DQ till the second control bit is applied to the latch 128D. The first control bit is thus initially latched in latch 128D and applied as COND2 to the latch 127D. When the second mode set code MSC2 is applied to the latch 127D, the first control bit from the latch 128D is latched in latch 127D to provide that the control signal COND1 is set by the first control bit. In addition, the second control bit and the second mode set code MSC2 are applied to the latch 128D so that the second control bit is latched into the latch 128D to provide that the control signal COND2 is set by the second control bit.

As discussed above with respect to FIGS. 1–13, two serially coupled latches may be provided in each of the input/output buffers 117-1 to 117-n to provide two control signals. More particularly, two control signals COND1 and COND2 may provide four different levels of an operational characteristic such as a delay of an output circuit. In an alternative, two control signals may provide binary control of two different operational characteristics.

Figure 14:
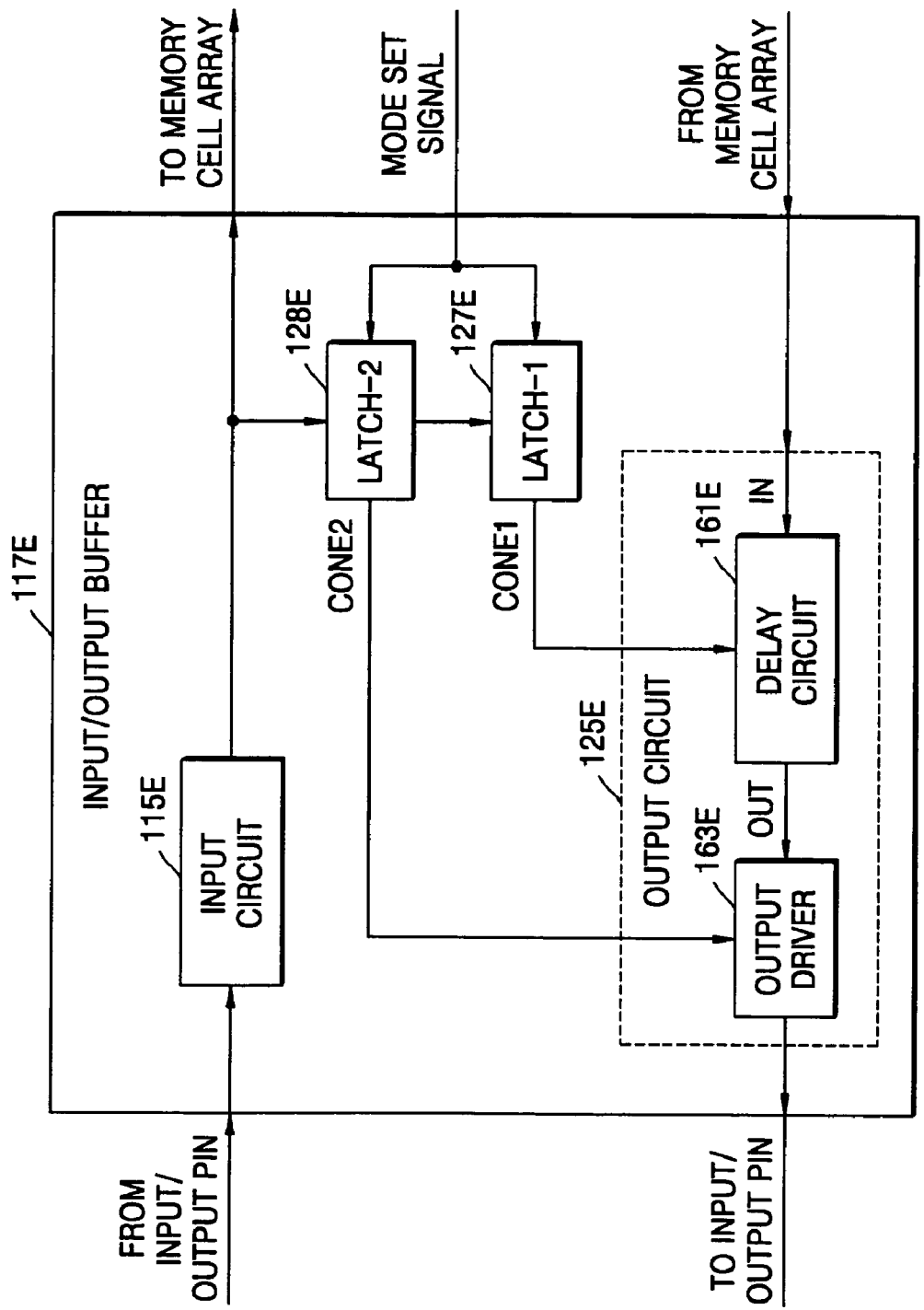
FIG. 14 is a block diagram illustrating input/output buffers according to more embodiments of the present invention.

As shown in FIG. 14, an input/output buffer 117E may include input circuit 115E, latches 127E and 128E, and output circuit 125E including delay circuit 161E and output driver 163E. The control signal CONE1 may provide binary control of a delay of delay circuit 161E as discussed above with respect to FIGS. 5 and 6A–C. The control signal CONE2 may provide binary control of a driver strength of output driver 163E as discussed above with respect to FIGS. 7 and 8A.

Figure 15:
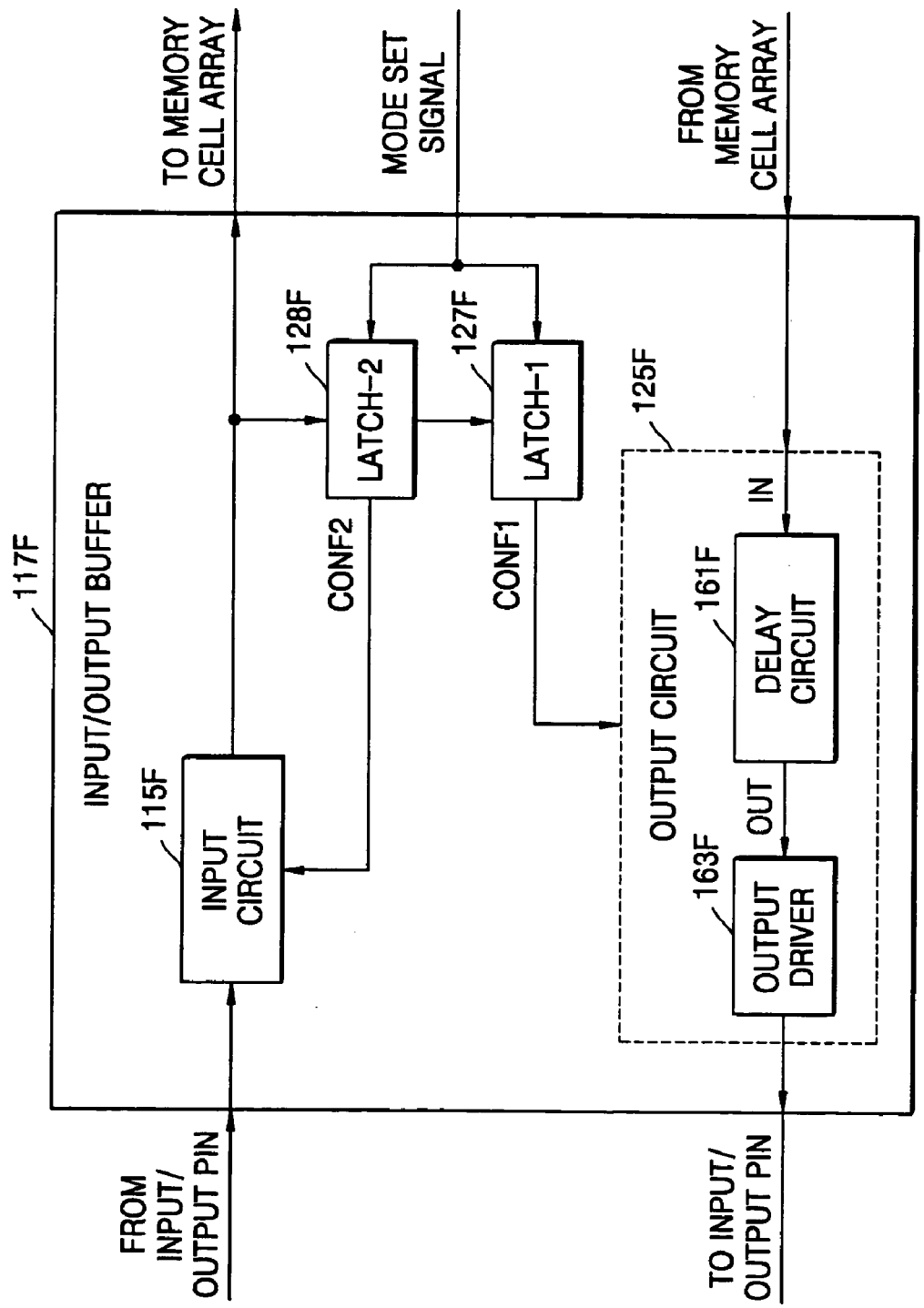
FIG. 15 is a block diagram illustrating input/output buffers according to still more embodiments of the present invention.

As shown in FIG. 15, an input/output buffer 117F may include input circuit 115F, latches 127F and 128F, and output circuit 125F including delay circuit 161F and output driver 163F. The control signal CONF1 may provide binary control of an operational characteristic of the output circuit, and the control signal CONF2 may provide binary control of an operational characteristic of the input circuit 115F. The control signal CONF1, for example, may provide binary control of a delay of delay circuit 161F as discussed above with respect to FIGS. 5 and 6A–C or binary control of a driver strength of output driver 163F as discussed above with respect to FIGS. 7 and 8A. The binary control signal CONF2 may provide binary control of a delay of a setup/hold circuit of the input circuit 115F as discussed above with respect to FIG. 9.

As discussed above with respect to FIG. 3A, an input circuit 115 and an output circuit 125 of a same input/output buffer 117 may be connected to a shared input/output pin 119. Integrated circuit memory devices according to embodiments of the present invention may also be implemented with separate input and output pins.

Figure 16:
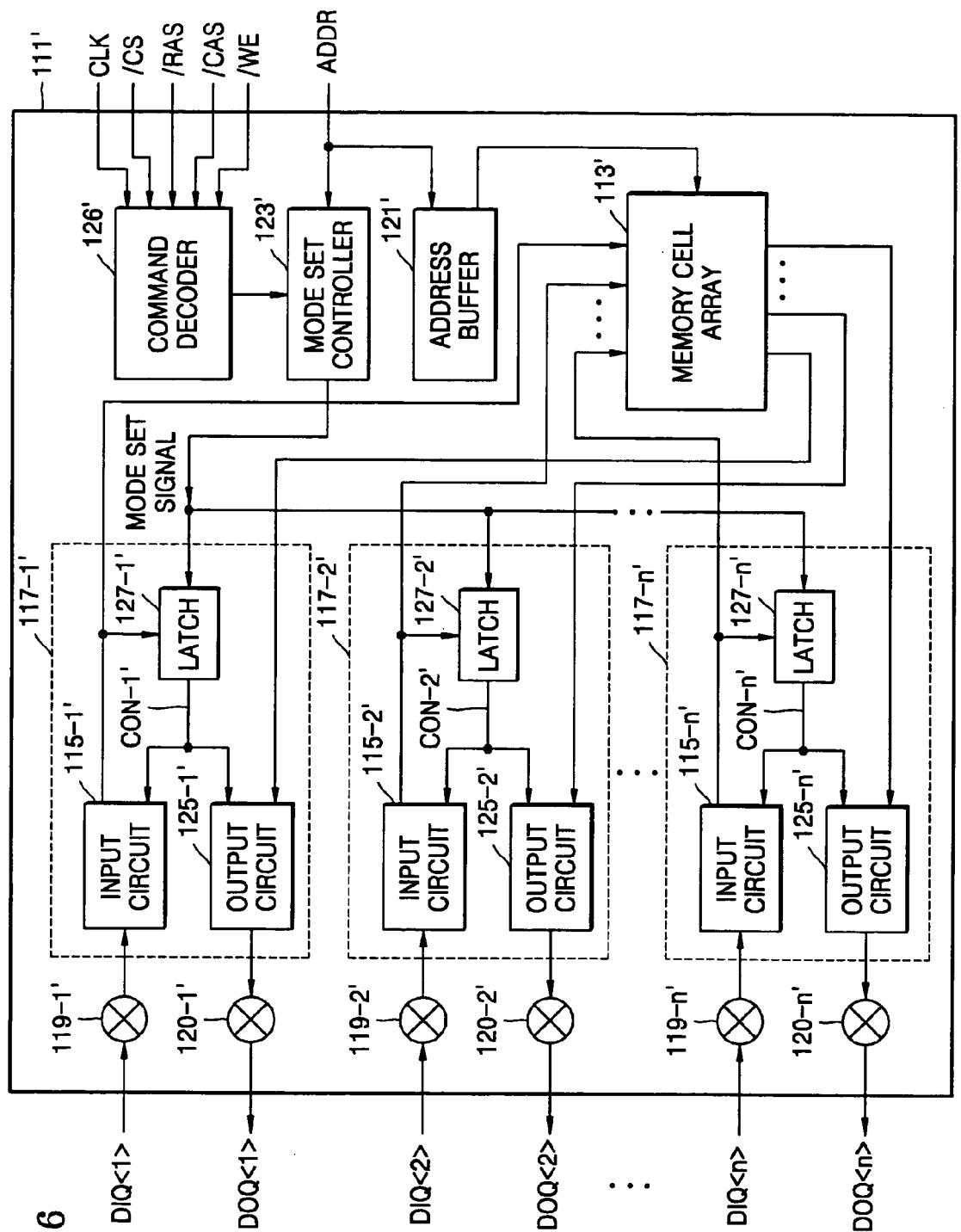
FIG. 16 is a block diagram illustrating integrated circuit memory devices according to additional embodiments of the present invention.

As shown in FIG. 16, the memory device 111' may include command decoder 126', mode set controller 123', address buffer 121', memory cell array 113', input/output buffers 117-1' to 117-n', data input pins 119-1' to 119-n' (configured to receive data input DIQ<1> to DIQ<n>), and data output pins 120-1' to 120-n' (configured to provide data output DOQ<1> to DOQ<n>). Each of the input/output buffers 117-1' to 117-n' may include respective latches 127-1' to 127-n', output circuits 125-1' to 125-n' (coupled to data output pins 119-1' to 119-n'), and input circuits 115-1' to 115-n' (coupled to data input pins 120-1' to 120-n'). Moreover, the memory device 111' may be a static random access memory device (SRAM).

The latches 127-1' to 127-n', output circuits 125-1' to 125-n', and input circuits 115-1' to 115-n' of FIG. 16 operate as discussed above with respect to FIG. 3A. Accordingly, a same mode set signal may be applied to the latches 127-1' to 127-n' while respective control bits are applied to the data input pins 119-1' to 119-n' to latch the control bits in the respective latches 127-1' to 127-n'. Once the mode set operation is complete, the control signals CON-1' to CON-n' may be set by the respective control bits. Accordingly, each control signal CON-1' to CON-n' may provide binary control for an operational characteristic of the respective input/output buffer 117-1' to 117-n'. A control signal, for example, may provide binary control of a delay of the output circuit, a driver strength of the output circuit, and/or a delay of the input circuit. If two serially coupled latches are provided in each input/output buffer, 4-way control may be provided for an operational characteristic of each input/output buffer, or binary control may be provided for two operational characteristics of each input/output buffer.

Figure 17:
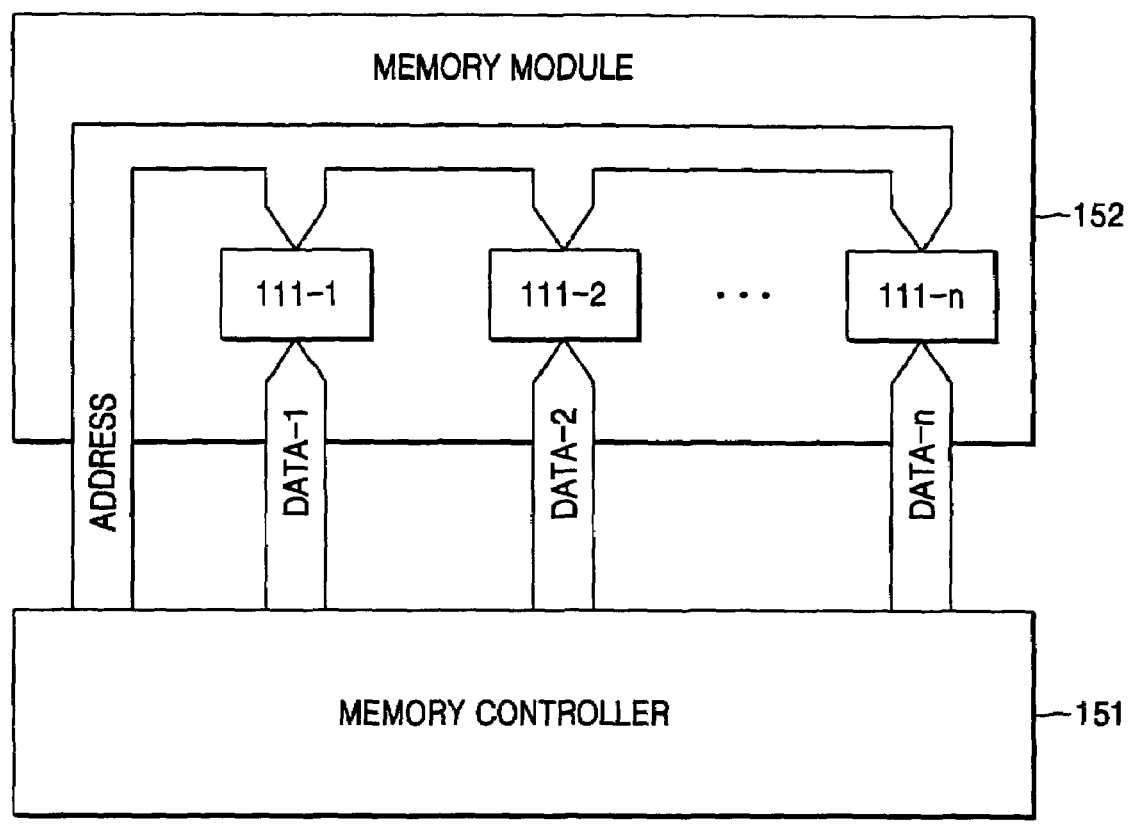
FIG. 17 is a block diagram illustrating memory systems including pluralities of memory devices according to embodiments of the present invention.

FIG. 17 illustrates a memory system including a memory controller 151 and a memory module 152 having a plurality of integrated circuit memory devices 111-1 to 111-n according to embodiments of the present invention. As shown, a same address bus ADDRESS may be coupled between the memory controller 151 and each of the memory devices 111-1 to 111-n. The address bus may include address lines used to transmit address signals (such as ADDR) to the memory devices, a clock line used to transmit a clock signal (such as CLK), and command lines used to transmit command signals (such as /CS, /RAS, /CAS, and/or /WE).

In contrast, a separate data bus DATA-1 to DATA-n may be provided between the memory controller 151 and each of the memory devices 111-1 to 111-n. If the memory devices 111-1 to 111-n are implemented as discussed above with regard to memory device 111 of FIG. 3A, each data bus DATA-1 to DATA-n may include a plurality of data lines transmitting input/output data DQ<1> to DQ<n>. If the memory devices 111-1 to 111-n are implemented as discussed above with regard to memory device 111' of FIG. 16, each data bus DATA-1 to DATA-n may include a plurality of input data lines transmitting input data DIQ<1> to DIQ<n> and a plurality of output data lines transmitting output data DOQ<1> to DOQ<n>. The data buses DATA-1 to DATA-n may include additional lines such as respective data strobe lines and/or data mask lines.

During a data read operation, a data read command may be transmitted by the memory controller 151 over the address bus ADDRESS to each of the memory devices 111-1 to 111-*n*. In addition, address signals may be transmitted over address lines of the address bus to the memory devices 111-1 to 111-*n* to identify memory cells of the memory devices from which data is to be read. Responsive to the data read command and the address signals received over the address bus ADDRESS, each of the memory devices 111-1 to 111-*n* may transmit data over the respective data buses DATA-1 to DATA-n to the memory controller 151. Accordingly, data can be read from the plurality of memory devices during a same read operation.

During a data write operation, a data write command may be transmitted by the memory controller 151 over the address bus ADDRESS to each of the memory devices 111-1 to 111-*n*. In addition, address signals may be transmitted over address lines of the address bus to the memory devices 111-1 to 111-*n* to identify memory cells of the memory devices to which data is to be written, and data to be written to the memory devices may be provided over the respective data buses DATA-1 to DATA-n. Responsive to the data write command, the address signal, and the data provided by the memory controller 151 over the data buses, the memory devices may write data received from the memory controller during a same write operation.

During a mode set operation, a mode set command and a mode set code may be transmitted by the memory controller 151 over the address bus ADDRESS to each of the memory devices 111-1 to 111-*n*. In addition, control bits may be provided by the memory controller 151 over the data buses DATA-1 to DATA-n to data inputs of each of the memory devices 111-1 to 111-*n*. In response to the mode set command, the mode set code, and the control bits, the memory devices may modify operational characteristics of input/output circuits thereof wherein an operational characteristic of each input/output circuit of each memory device is defined by a respective control bit received over the data buses.

While the invention has been particularly shown and described with reference to exemplary embodiments thereof, it will be understood by those of ordinary skill in the art that various changes in form and details may be made therein without departing from the spirit and scope of the invention as defined by the following claims.

That which is claimed is:

1. An integrated circuit memory device comprising:
   a memory cell array;
   a plurality of data input/output pins; and
   a plurality of input/output circuits coupled to respective data input/output pins, wherein the input/output circuits are configured to accept respective data bits being written to the memory cell array from the respective data input/output pins during a write operation and wherein the input/output circuits are configured to provide respective data bits being read from the memory cell array to the respective data input/output pins during a read operation, wherein each of at least three of the input/output circuits is configured to modify an operational characteristic thereof responsive to each of at least three respective control bits received through each of at least three of the respective data input/output pins respectively coupled to the each of the at least three of the input/output circuits during a mode set operation.

2. An integrated circuit memory device according to claim 1 wherein each of the input/output circuits includes,
   an input circuit configured to accept a data bit from the respective data input/output pin being written to the memory cell array during the write operation and configured to accept a control bit received through the respective data input/output pin during the mode set operation,
   an output circuit configured to provide a data bit being read from the memory cell array to the respective data input/output pin during the read operation, and
   a latch circuit configured to latch the control bit accepted by the input circuit during the mode set operation.

3. An integrated circuit memory device according to claim 2 wherein each input/output circuit is configured to modify a driver strength of the respective output circuit responsive to the control bit latched in the respective latch circuit.

4. An integrated circuit memory device according to claim 2 wherein each of the input/output circuits is configured to modify a delay of the respective output circuit responsive to the control bit latched in the respective latch circuit.

5. An integrated circuit memory device according to claim 2 wherein each of the input/output circuits is configured to modify a delay of the respective input circuit responsive to the control bit latched in the respective latch circuit.

6. An integrated circuit memory device according to claim 1 wherein each of the input/output circuits includes a respective latch circuit configured to latch a respective control bit received through the respective data input/output pin during the mode set operation.

7. An integrated circuit memory device according to claim 6 further comprising:
   a mode set decoder configured to receive a mode set code during the mode set operation, the mode set decoder being further configured to generate a latch signal responsive to the mode set code, and the latch circuits being configured to latch the control bits received through the respective data input/output pins responsive to the latch signal during the mode set operation.

8. An integrated circuit memory device according to claim 7 further comprising:
   a plurality of address pins, wherein during the write operation, a write address received at the plurality of address pins defines locations of the memory cell array to which the data bits accepted at the input/output circuits are to be written, wherein during the read operation, a read address received at the plurality of address pins defines locations of the memory cell array from which the data bits provided to the data input/output pins are read, and wherein during the mode set operation, the mode set code is received by the mode set decoder through the plurality of address pins.

9. A memory system comprising:
   an integrated circuit memory device including a memory cell array, a plurality of data input/output pins, and a plurality of input/output circuits coupled to respective data input/output pins, wherein the input/output circuits are configured to accept respective data bits from the respective data input/output pins for writing to the memory cell array during a write operation and wherein the input/output circuits are configured to provide respective data bits being read from the memory cell array to the respective data input/output pins during a read operation, wherein each of at least three of the input/output circuits is configured to modify an operational characteristic thereof responsive to each of at least three respective control bits received through each of at least three of the respective data input/output pins respectively coupled to the each of the at least three of the input/output circuits during a mode set operation; and a memory controller coupled to the integrated circuit memory device, the memory controller being configured to provide data bits to the data input/output pins to be written to the memory cell during the write operation, being configured to accept data bits from the data input/output pins during the read operation, and being configured to provide the at least three control bits to the at least three of the respective data input/output pins during the mode set operation to thereby modify the operational characteristic of the each of the at least three input/output circuits.

10. A memory system according to claim 9 wherein each of the input/output circuits includes,
an input circuit configured to accept a data bit from the respective data input/output pin being written to the memory cell array during the write operation and configured to accept a control bit received through the respective data input/output pin during the mode set operation,
an output circuit configured to provide a data bit being read from the memory cell array to the respective data input/output pin during the read operation, and
a latch circuit configured to latch the control bit accepted by the input circuit during the mode set operation.

11. A memory system according to claim 10 wherein each input/output circuit is configured to modify a driver strength of the respective output circuit responsive to the control bit latched in the respective latch circuit.

12. A memory system according to claim 10 wherein each input/output circuit is configured to modify a delay of the respective output circuit responsive to the control bit latched in the respective latch circuit.

13. A memory system according to claim 10 wherein each input/output circuit is configured to modify a delay of the respective input circuit responsive to the control bit latched in the respective latch circuit.

14. A memory system according to claim 9 wherein each input/output circuit includes a respective latch circuit configured to latch the control bit received through the respective data input/output pin during the mode set operation.

15. A memory system according to claim 14 further comprising:
a mode set decoder configured to receive a mode set code during the mode set operation, the mode set decoder being further configured to generate a latch signal responsive to the mode set code, and the latch circuits being configured to latch the control bits received through the respective data input/output pins responsive to the latch signal during the mode set operation.

16. A memory system according to claim 15 wherein the integrated circuit memory device includes a plurality of address pins, wherein during the write operation, a write address received at the plurality of address pins defines a location of the memory cell array to which the data bits accepted at the input/output circuits are to be written, wherein during the read operation, a read address received at the plurality of address pins defines a location of the memory cell array from which the data bits provided to the data input/output pins are read, and wherein during the mode set operation, the mode set code is received by the mode set decoder through the plurality of address pins.

17. A memory system comprising:
an integrated circuit memory device including a memory cell array, a plurality of data input/output pins, and a plurality of input/output circuits coupled to respective data input/output pins, wherein the input/output circuits are configured to accept respective data bits from the respective data input/output pins for writing to the memory cell array during a write operation and wherein the input/output circuits are configured to provide respective data bits being read from the memory cell array to the respective data input/output pins during a read operation, wherein at least one of the input/output circuits is configured to modify an operational characteristic thereof responsive to a control bit received through the respective data input/output pin during a mode set operation;
a memory controller coupled to the integrated circuit memory device, the memory controller being configured to provide data bits to the data input/output pins to be written to the memory cell during the write operation, being configured to accept data bits from the data input/output pins during the read operation, and being configured to provide the control bit to the input/output pin during the mode set operation to thereby modify the operational characteristic of the at least one input/output circuit; and
a second integrated circuit memory device including a second memory cell array, a second plurality of data input/output pins, and a second plurality of input/output circuits with the second plurality of input/output circuits being coupled to respective data input/output pins of the second integrated circuit memory device, wherein the second plurality of input/output circuits is configured to accept respective data bits from respective ones of the second plurality of data input/output pins for writing to the second memory cell array during the write operation and wherein the second plurality of input/output circuits is configured to provide data bits being read from the second memory cell array to respective ones of the second plurality of data input/output pins during the read operation, wherein the second plurality of input/output circuits is configured to modify operational characteristics thereof responsive to respective control bits received through the respective data input/output pins during the mode set operation.

18. A method of operating an integrated circuit memory device including a memory cell array, a plurality of data input/output pins, and a plurality of input/output circuits coupled between the memory cell array and respective data input/output pins, the method comprising:
accepting data bits from the data input/output pins at respective input/output circuits for writing to the memory cell array during a write operation;
providing data bits to the data input/output pins from respective input/output circuits, the data bits being read from the memory cell array during a read operation; and
modifying an operational characteristic of each of at least three of the input/output circuits responsive to each of at least three respective control bits received through each of at least three of the respective data input/output pins respectively coupled to the each of the at least three of the input/output circuits during a mode set operation.

19. A method according to claim 18 wherein the input/output circuits include respective input circuits and respective output circuits;
wherein accepting data bits during the write operation comprises accepting the data bits at the respective input circuits;
wherein providing the data bits during the read operation comprises providing the data bits from the respective output circuits; and wherein modifying the operational characteristic comprises accepting the control bits at the respective input circuits.

20. A method according to claim 19 wherein the input/output circuits include respective latch circuits, wherein modifying the operational characteristic comprises latching the control bits in the respective latch circuits.

21. A method according to claim 19 wherein modifying the operational characteristic comprises modifying respective driver strengths of the respective output circuits responsive to the control bits.

22. A method according to claim 19 wherein modifying the operational characteristic comprises modifying respective delays of the respective output circuits responsive to the control bits.

23. A method according to claim 19 wherein modifying the operational characteristic comprises modifying respective delays of the respective input circuits responsive to the control bits.

24. A method according to claim 18 wherein the input/output circuits include respective latch circuits, wherein modifying the operational characteristic comprises latching the control bits in the respective latch circuits.

25. A method according to claim 24 wherein modifying the operational characteristic further comprises,
receiving a mode set code during the mode set operation,
generating a latch signal responsive to the mode set code, and
latching the control bits received through the respective data input/output pins responsive to the latch signal during the mode set operation.

26. A method according to claim 25 wherein the integrated circuit memory device further includes a plurality of address pins, the method further comprising:
during the write operation, receiving a write address at the plurality of address pins defining a location of the memory cell array to which the data bits are to be written;
during the read operation, receiving a read address at the plurality of address pins defining a location of the memory cell array from which the data bits are to be read; and
during the mode set operation, receiving the mode set code through the plurality of address pins.

27. A method of controlling an integrated circuit memory device including a memory cell array, a plurality of data input/output pins, a plurality of input/output circuits, and a plurality of address pins, with the input/output circuits being coupled between the memory cell array and respective data input/output pins, the method comprising:
during a write operation, providing a write address to the address pins and providing write data to the data input/output pins to be written to the memory cell array, wherein the write address defines a location of the memory cell array to which the write data is written;
during a read operation, providing a read address through the plurality of address pins and accepting read data from the input/output pins, wherein the read address defines a location of the memory cell array from which the read data is read; and
during a mode set operation, providing a mode set code through the address pins and providing control bits to each of the input/output pins, each control bit defining an operational characteristic of the respective input/output circuits.

28. A method according to claim 27 wherein the operational characteristic comprises a driver strength of the respective input/output circuits.

29. A method according to claim 27 wherein the operational characteristic comprises a delay of the respective input/output circuits.

30. An integrated circuit memory device comprising:
a memory cell array;
a plurality of data input pins; and
a plurality of input/output circuits coupled to respective data input pins, wherein the input/output circuits are configured to accept data bits being written to the memory cell array from the respective data input pins during a write operation, wherein each of at least three of the input/output circuits is configured to modify an operational characteristic thereof responsive to each of at least three respective control bits received through each of at least three of the respective data input pins respectively coupled to the each of the at least three of the input/output circuits during a mode set operation.

31. An integrated circuit memory device according to claim 30 further comprising:
a plurality of data output pins coupled to the memory cell array through respective input/output circuits.

32. An integrated circuit memory device according to claim 31 wherein the input/output circuits comprise respective input circuits, output circuits, and latch circuits, the respective input circuits being configured to accept data bits from the respective data input pins during the write operation and to accept the control bits from the respective data input pins during the mode set operation, the respective output circuits being configured to provide data bits being read from the memory cell array to the respective data output pins during a read operation, and the respective latch circuits being configured to latch the control bits from the respective input circuits during the mode set operation.

33. An integrated circuit memory device according to claim 32 wherein the input/output circuits are configured to modify driver strengths of the respective output circuits responsive to the respective control bits.

34. An integrated circuit memory device according to claim 32 wherein the input/output circuits are configured to modify delays of the respective output circuits responsive to the respective control bits.

35. An integrated circuit memory device according to claim 32 wherein the input/output circuits are configured to modify delays of the respective input circuits responsive to the respective control bits.

36. An integrated circuit memory device according to claim 30 wherein the input/output circuits include respective latch circuits configured to latch the respective control bits accepted during the mode set operation.

37. An integrated circuit memory device according to claim 36 further comprising:
a mode set decoder configured to receive a mode set code during the mode set operation, the mode set decoder being further configured to generate a latch signal responsive to the mode set code, and the latch circuits being configured to latch the respective control bits responsive to the latch signal during the mode set operation.

38. An integrated circuit memory device according to claim 37 further comprising:
a plurality of address pins, wherein during the write operation, a write address received at the plurality of address pins defines a location of the memory cell array to which the data bits are to be written, and wherein during the mode set operation, the mode set code is received by the mode set decoder through the plurality of address pins.

39. A method of operating an integrated circuit memory device including a memory cell array, a plurality of data input pins, and a plurality of input/output circuits coupled between the memory cell array and respective data input pins, the method comprising:
accepting data bits from the data input pins at respective input/output circuits for writing to the memory cell array during a write operation; and
modifying an operational characteristic of each of at least three of the input/output circuits responsive to each of at least three respective control bits received through each of at least three of the respective data input pins respectively coupled to the each of the at least three of the input/output circuits during a mode set operation.

40. A method according to claim 39 wherein the integrated circuit memory device further includes a plurality of data output pins coupled with the memory cell array through respective input/output circuits, the method further comprising:
providing data bits to data output pins from respective input/output circuits, the data bits being read from the memory cell array during a read operation.

41. A method according to claim 40 wherein the input/output circuits include respective input and output circuits;
wherein accepting data bits during the write operation comprises accepting the data bits at the respective input circuits;
wherein providing data bits during the read operation comprises providing the data bits from the respective output circuits; and
wherein modifying an operational characteristic comprises accepting the control bits at the respective input circuits during the mode set operation.

42. A method according to claim 41 wherein each of the input/output circuits includes a respective latch circuit, wherein modifying an operational characteristic comprises latching the control bits in the respective latch circuits during the mode set operation.

43. A method according to claim 41 wherein modifying an operational characteristic comprises modifying a driver strength of each of the at least three of the respective output circuits responsive to each of the respective control bits.

44. A method according to claim 41 wherein modifying an operational characteristic comprises modifying a delay of each of the at least three of the respective output circuits responsive to the respective control bits.

45. A method according to claim 41 wherein modifying an operational characteristic comprises modifying a delay of each of the at least three of the respective input circuits responsive to the respective control bits.

46. A method according to claim 39 wherein each of the input/output circuits includes a latch circuit, wherein modifying an operational characteristic comprises latching the control bit bits in the respective latch circuits.

47. A method according to claim 46 wherein modifying an operational characteristic further comprises,
receiving a mode set code during the mode set operation,
generating a latch signal responsive to the mode set code, and
latching control bits received through the respective data input/output circuits responsive to the latch signal during the mode set operation.

48. A method according to claim 47 wherein the integrated circuit memory device further includes a plurality of address pins, the method further comprising:
during the write operation, receiving a write address at the plurality of address pins defining a location of the memory cell array to which the data bits are to be written; and
during the mode set operation, receiving the mode set code through the plurality of address pins.

49. An integrated circuit memory device comprising:
a memory cell array;
a plurality of data input pins; and
a plurality of input circuits coupled to respective data input pins, wherein the input circuits are configured to accept data bits being written to the memory cell array from the respective data input pins during a write operation, wherein each of at least three of the input circuits is configured to modify an operational characteristic thereof responsive to each of at least three respective control bits received through each of at least three of the respective data input pins respectively coupled to the each of the at least three of the input circuits during a mode set operation.

50. An integrated circuit memory device according to claim 49 wherein the input circuits are configured to modify respective delays thereof responsive to the respective control bits.

51. An integrated circuit memory device according to claim 49 further comprising:
latch circuits corresponding to respective input circuits, the latch circuits being configured to latch the respective control bits accepted during the mode set operation.

52. An integrated circuit memory device according to claim 51 further comprising:
a mode set decoder configured to receive a mode set code during the mode set operation, the mode set decoder being further configured to generate a latch signal responsive to the mode set code, and the latch circuits being configured to latch the respective control bits responsive to the latch signal during the mode set operation.

53. An integrated circuit memory device according to claim 52 further comprising:
a plurality of address pins, wherein during the write operation, a write address received at the plurality of address pins defines a location of the memory cell array to which the data bits are to be written, and wherein during the mode set operation, the mode set code is received by the mode set decoder through the plurality of address pins.

54. A method of operating an integrated circuit memory device including a memory cell array, a plurality of data input pins, and a plurality of input circuits coupled between the memory cell array and respective data input pins, the method comprising:
accepting data bits from the data input pins at respective input circuits for writing to the memory cell array during a write operation; and
modifying an operational characteristic of each of at least three of the input circuits responsive to each of at least three control bits received through each of at least three of the respective data input pins respectively coupled to the each of the at least three of the input circuits during a mode set operation.

55. A method according to claim 54 wherein the integrated circuit memory device further includes a plurality of data output pins coupled with the memory cell array through respective output circuits, the method further comprising:

providing data bits to data output pins from respective output circuits, the data bits being read from the memory cell array during a read operation.

56. A method according to claim 55 wherein accepting data bits during the write operation comprises accepting the data bits at the respective input circuits, wherein providing data bits during the read operation comprises providing the data bits from the respective output circuits, and wherein modifying an operational characteristic comprises accepting each of the at least three control bits at the respective input circuits during the mode set operation.

57. A method according to claim 54 wherein the integrated circuit memory device includes a pluralijy of latch circuits corresponding to the plurality of input circuits, wherein modifying an operational characteristic comprises latching the control bits in the respective latch circuits during the mode set operation.

58. A method according to claim 54 wherein modifying an operational characteristic comprises modifying a delay of the respective input circuits responsive to the respective control bits.

59. A method according to claim 54 wherein modifying an operational characteristic further comprises, receiving a mode set code during the mode set operation, generating a latch signal responsive to the mode set code, and latching control bits received through the respective data input circuits responsive to the latch signal during the mode set operation.

60. A method according to claim 59 wherein the integrated circuit memory device further includes a plurality of address pins, the method further comprising:

during the write operation, receiving a write address at the plurality of address pins defining a location of the memory cell array to which the data bits are to be written; and during the mode set operation, receiving the mode set code through the plurality of address pins.

61. An integrated circuit memory device comprising:

a memory cell array;

a plurality of data output pins;

a plurality of data input pins;

a plurality of output circuits coupled to respective data output pins, wherein the output circuits are configured to provide data bits being read from the memory cell array to the respective data output pins during a read operation; and a plurality of input circuits coupled to respective data input pins, wherein the input circuits are configured to accept data bits being written to the memory cell array from the respective data input pins during a write operation, wherein each of at least three of the input circuits is configured to modify an operational characteristic of a respective output circuit responsive to each of at least three control bits received through each of at least three of the respective data input pins respectively coupled to the each of the at least three of the input circuits during a mode set operation.

62. An integrated circuit memory device according to claim 61 wherein the input circuits are configured to modify driver strengths of the respective output circuits responsive to the respective control bits.

63. An integrated circuit memory device according to claim 61 wherein the input circuits are configured to modify delays of the respective output circuits responsive to the respective control bits.

64. An integrated circuit memory device according to claim 61 further comprising:

latch circuits configured to latch the respective control bits accepted during the mode set operation.

65. An integrated circuit memory device according to claim 64 further comprising:

a mode set decoder configured to receive a mode set code during the mode set operation, the mode set decoder being further configured to generate a latch signal responsive to the mode set code, and the latch circuits being configured to latch the respective control bits responsive to the latch signal during the mode set operation.

66. An integrated circuit memory device according to claim 65 further comprising:

a plurality of address pins, wherein during the write operation, a write address received at the plurality of address pins defines a location of the memory cell array to which the data bits are to be written, and wherein during the mode set operation, the mode set code is received by the mode set decoder through the plurality of address pins.

67. A method of operating an integrated circuit memory device including a memory cell array, a plurality of data input pins, a plurality of data output pins, a plurality of input circuits coupled between the memory cell array and respective data input pins, and a plurality of output circuits coupled between the memory cell array are respective output pins, the method comprising:

providing data bits to data output pins from respective output circuits, the data bits being read from the memory cell array during a read operation;

accepting data bits from the data input pins at respective input circuits for writing to the memory cell array during a write operation; and modifying an operational characteristic of each of at least three of the output circuits responsive to each of at least three respective control bits received through each of at least three of the data input pins respectively coupled to the each of at least three of the data input pins during a mode set operation.

68. A method according to claim 67 wherein modifying an operational characteristic comprises modifying a driver strength of each of the at least three of the output circuits responsive to each of the at least three respective control bits.

69. A method according to claim 67 wherein modifying an operational characteristic comprises modifying a delay of each of the at least three of the output circuits responsive to each of the at least three respective control bits.

70. A method according to claim 67 wherein the integrated circuit memory device includes a plurality of latch circuits corresponding to the input circuits, wherein modifying an operational characteristic comprises latching the control bits in the respective latch circuits during the mode set operation.

71. A method according to claim 70 wherein modifying an operational characteristic further comprises, receiving a mode set code during the mode set operation, generating a latch signal responsive to the mode set code, and latching control bits received through the respective data input circuits responsive to the latch signal during the mode set operation.

72. A method according to claim 71 wherein the integrated circuit memory device further includes a plurality of address pins, the method further comprising:

during the write operation, receiving a write address at the plurality of address pins defining a location of the memory cell array to which the data bits are to be written; and during the mode set operation, receiving the mode set code through the plurality of address pins.

73. A method of operating an integrated circuit memory device including a memory cell array, a plurality of input/output pins, and a plurality of input/output circuits coupled between the memory cell array and respective data input/output pins wherein each of the input/output circuits includes a pair of serially coupled latches, the method comprising:

accepting data bits from the data input/output pins at respective input/output circuits for writing to the memory cell array during a write operation;

providing data bits to the data input/output pins from respective input/output circuits, the data bits being read from the memory cell array during a read operation;

modifying operational characteristics of the input/output circuits responsive to first control bits and second control bits serially received through the respective data input/output pins during a mode set operation, wherein modifying the operational characteristics comprises, receiving the first control bits through the respective data input/output pins and input/output circuits during the mode set operation, after receiving the first control bits, receiving the second control bits through the respective data input/output pins and input/output circuits during the mode set operation, and latching the first control bits and the second control bits in the respective pairs of serially coupled latches during the mode set operation.

* * * * *